United States Patent
Chu et al.

(10) Patent No.: US 8,232,614 B1
(45) Date of Patent: Jul. 31, 2012

(54) PACKAGE SYSTEMS HAVING A CONDUCTIVE ELEMENT THROUGH A SUBSTRATE THEREOF AND MANUFACTURING METHODS OF THE SAME

(75) Inventors: Chia-Hua Chu, Zhubei (TW);
Kuei-Sung Chang, Kaohsiung (TW);
Chung-Hsien Lin, Hsinchu (TW);
Chia-Ming Hung, Taipei (TW);
Jung-Huei Peng, Jhubei (TW); Yi Heng Tsai, Hsinchu (TW); Jiou-Kang Lee, Zhu-Bei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/042,733

(22) Filed: Mar. 8, 2011

(51) Int. Cl.
*H01L 21/52* (2006.01)

(52) U.S. Cl. ................ 257/414; 257/E29.324

(58) Field of Classification Search .......... 257/414–416, 257/E29.324, 417; 438/50
See application file for complete search history.

(56) References Cited

U.S. PATENT DOCUMENTS

| | | | |
|---|---|---|---|
| 2010/0148293 A1* | 6/2010 | Jain et al. ............ | 257/434 |
| 2010/0176466 A1* | 7/2010 | Fujii et al. ........... | 257/415 |
| 2010/0193884 A1* | 8/2010 | Park et al. ............ | 257/414 |
| 2011/0186941 A1* | 8/2011 | van Wingerden et al. ..... | 257/414 |
| 2011/0193183 A1* | 8/2011 | Agarwal et al. ............ | 257/414 |
| 2011/0221013 A1* | 9/2011 | Partridge et al. ............ | 257/414 |
| 2011/0260265 A1* | 10/2011 | Wilson ............ | 257/414 |

* cited by examiner

*Primary Examiner* — Nathan Ha
(74) *Attorney, Agent, or Firm* — Lowe Hauptman Ham & Berner, LLP

(57) ABSTRACT

A package system includes a first substrate structure including at least one first conductive structure that is disposed over a first substrate. A second substrate structure includes a second substrate. The second substrate structure is bonded with the first substrate structure. The at least one first conductive structure is electrically coupled with the second substrate through at least one germanium-containing layer.

20 Claims, 37 Drawing Sheets

PACKAGE SYSTEMS HAVING A CONDUCTIVE ELEMENT THROUGH A SUBSTRATE THEREOF AND MANUFACTURING METHODS OF THE SAME

TECHNICAL FIELD

The present disclosure relates generally to the field of semiconductor package systems, and more particularly, to package systems and manufacturing methods thereof.

BACKGROUND OF THE DISCLOSURE

Micro electro mechanical system (MEMS) devices are a recent development in the field of integrated circuit technology and include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
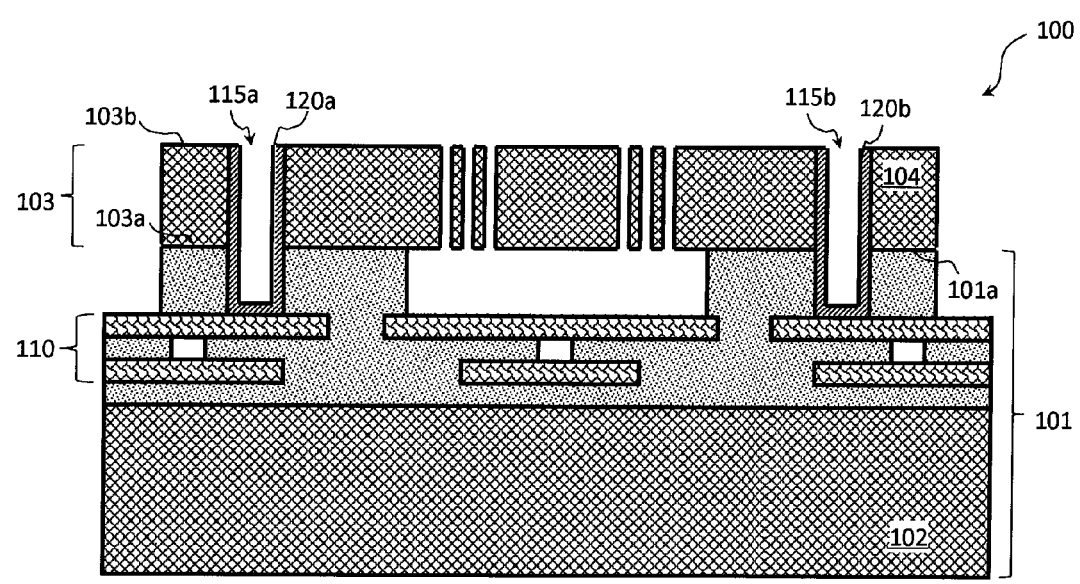
FIGS. 1-11 are schematic cross-sectional views of various exemplary package systems of the current application.

Generally, a MEMS package system has a complementary metal-oxide-semiconductor (CMOS) substrate that is electrically coupled with a MEMS substrate through a plurality of aluminum-copper (AlCu) via plugs. Currents can flow from pads of the CMOS substrate through the via plugs to the MEMS substrate. It is found that the MEMS substrate is made of silicon. A Schottky barrier height between the silicon substrate and the AlCu via plugs is so high such that the interface of the silicon substrate and the AlCu via plugs are not ohmic contacts. The non-ohmic contact interface of the silicon substrate and the AlCu via plugs results in a high resistance during the operation of the MEMS package system.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

The current application is related to package systems. In some embodiments, a package system can include a first substrate structure including at least one first conductive structure. The at least one first conductive structure can be disposed over a first substrate. A second substrate structure includes a second substrate. The second substrate structure can be bonded with the first substrate structure. The at least one first conductive structure can be electrically coupled with the second substrate through at least one germanium-containing layer.

FIG. 1 is a schematic cross-sectional view of an exemplary package system. In FIG. 1, a package system 100 can include a substrate structure 101 that can be bonded with a substrate structure 103. The substrate structure 101 can have a surface 101*a*. The substrate structure 103 can have surfaces 103*a* and 101*a*. The surface 103*a* of the substrate structure 103 can be bonded with the surface 101*a* of the substrate structure 101.

In some embodiments, the substrate structures 101 and 103 can be assembled to form a hermetic or non-hermetic package system. In some embodiments, the substrate structures 101 and 103 can include substrates 102 and 104, respectively. The substrates 102 and 104 can each include a silicon substrate doped with a P-type or N-type dopant. In other embodiments, the substrates 102 and 104 may each alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrates 102 and 104 could each include an epitaxial layer (epi layer), may be strained for performance enhancement, and may include a silicon-on-insulator (SOI) structure.

In some embodiments, the substrate structures 101 and 103 can each include at least one complementary metal-oxidesemiconductor (CMOS) integrated circuit, at least one micro electro mechanical system (MEMS) circuit, at least one interposer structure, other integrated circuits, and/or any combinations thereof. In some embodiments, the interposer structure can represent a substrate that may merely include a conductive wire routing for an electrical connection and be free from including any active device.

For example, the substrate structure 101 as shown in FIG. 1 can include an integrated circuit (not shown) formed thereon. In some embodiments, the integrated circuit can be formed, for example, by a complementary metal-oxide-semiconductor (CMOS) technology. The integrated circuit can include, for example but is not limited to, a logic circuit, an analog circuit, a mixed-signal circuit, and/or any suitable integrated circuit.

In some embodiments, the integrated circuit can include a conductive structure 110 that is disposed over the substrate 102. The conductive structure 110 can be embedded in an interconnect metallization structure (not labeled) that is formed over the substrate 102. The interconnect metallization structure can be configured to provide electrical interconnections among the active devices and/or passive devices formed on and/or over the substrate 102.

In some embodiments, the interconnect metallization structure can include a plurality of metallization layers. The metallization layers may each include at least one dielectric layer. The dielectric layer may include at least one material, such as silicon oxide, silicon nitride, silicon oxynitride, silicon carbide, silicon oxycarbide, low dielectric constant (low-k) dielectric material, ultra low-k dielectric material, other dielectric materials, or any combinations thereof.

In some embodiments, the conductive structure 110 can include at least one conductive line, at least one contact plug, at least one via plug, at least one damascene structure, at least one dual damascene structure, at least one pad, other conductive structures, and/or any combinations thereof. The conductive structure 110 can be made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable bonding materials, and/or any combinations thereof.

Referring again to FIG. 1, in some embodiments the substrate structure 103 can include at least one opening, e.g., openings 115a and 115b through the substrate structure 103. In some embodiments, the openings 115a-115b can extend into the substrate structure 101. In some embodiments, at least a portion of the at least one germanium-containing layer can be disposed on at least one sidewall of the opening.

For example, the package system 100 can include at least one germanium-containing layer, e.g., germanium-containing layers 120a and 120b, which can be disposed in the openings 115a-115b, respectively, as shown in FIG. 1. In some embodiments, the at least one germanium-containing layer can be made of substantially pure germanium or silicon-germanium ($Si_xGe_{1-x}$). In other embodiments, the at least one germanium-containing layer can be undoped or doped with N-type and/or P-type dopants. In still other embodiments, surfaces of the substrate 104 that adjoins the germanium-containing layers 120a and 120b can be doped with N-type and/or P-type dopants.

In some embodiments, the germanium-containing layer 120a can be disposed on at least one sidewall of the opening 115a. In other embodiments, the germanium-containing layer 120a can extend from the sidewall to the conductive structure 110. In still other embodiments, the germanium-containing layer 120a can extend from the sidewall to the conductive structure 110 and to the other sidewall of the opening 115a as shown in FIG. 1. In yet still other embodiments, the germanium-containing layer 120a can have a surface (not labeled) that can be substantially leveled with the surface 103b of the substrate structure 103.

As noted, the conductive structure 110 can be electrically coupled with the substrate 104 through at least one germanium-containing layer. For example, the conductive structure 110 can be made of AlCu and/or Ti. Since the energy band gap of the germanium-containing layers 120a and 120b is smaller than that of silicon, the Schottky barrier height between the germanium-containing layers 120a-120b and the AlCu/Ti conductive structure 110 is lower than that between silicon and AlCu. The resistance between the germanium-containing layers 120a-120b and the conductive structure 110 can be reduced. A current can flow from the conductive structure 110 through the germanium-containing layers 120a-120b to the substrate 104. The conductive structure 110 thus can be electrically coupled with the substrate structure 103 through the germanium-containing layers 120a and 120b.

In some embodiments, at least one conductive structure can be disposed in the opening and electrically coupled with the conductive structure of the first substrate structure through the at least one germanium-containing layer. For example, at least one conductive structure, e.g., conductive structures 230a-230b (shown in FIG. 2) can be disposed in openings that are similar to the openings 115a-115b described above in conjunction with FIG. 1. Items of FIG. 2 that are the same or similar items in FIG. 1 are indicated by the same reference numerals, increased by 100.

It is noted that the conductive structures 230a and 230b are electrically coupled with germanium-containing layers 220a and 220b, respectively. In some embodiments, the conductive structures 230a and 230b can be made of AlCu and/or Ti. Interfaces of the germanium-containing layers 220a and 220b and the conductive structures 230a and 230b, respectively, can have a low Schottky barrier height. The resistance between the germanium-containing layers 220a and 220b and the conductive structures 230a and 230b, respectively, can be reduced.

In some embodiments, the conductive structures 230a and 230b can each include at least one conductive line, at least one contact plug, at least one via plug, at least one damascene structure, at least one dual damascene structure, at least one pad, other conductive structures, and/or any combinations thereof. In other embodiments, the conductive structures 230a and 230b can be made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable bonding materials, and/or any combinations thereof. In other embodiments, top surfaces (not labeled) of the conductive structures 230a and 230b can be substantially leveled with a surface 203b of the substrate structure 203. In still other embodiments, the top surfaces (not labeled) of the conductive structures 230a and 230b can each be higher or lower than the surface 203b of the substrate structure 203.

Figure 2:
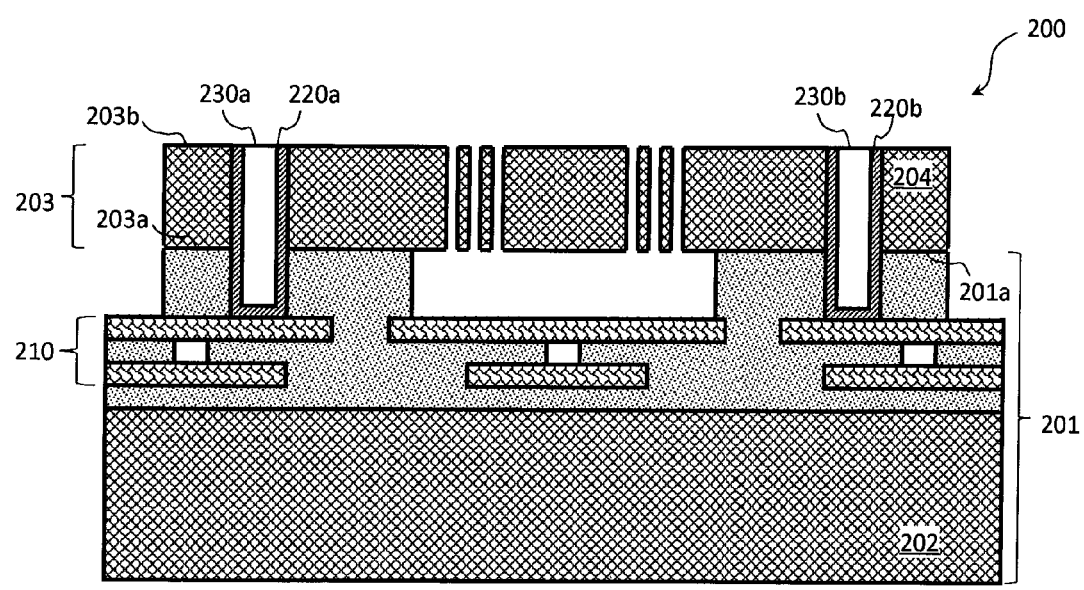
Figure 3:
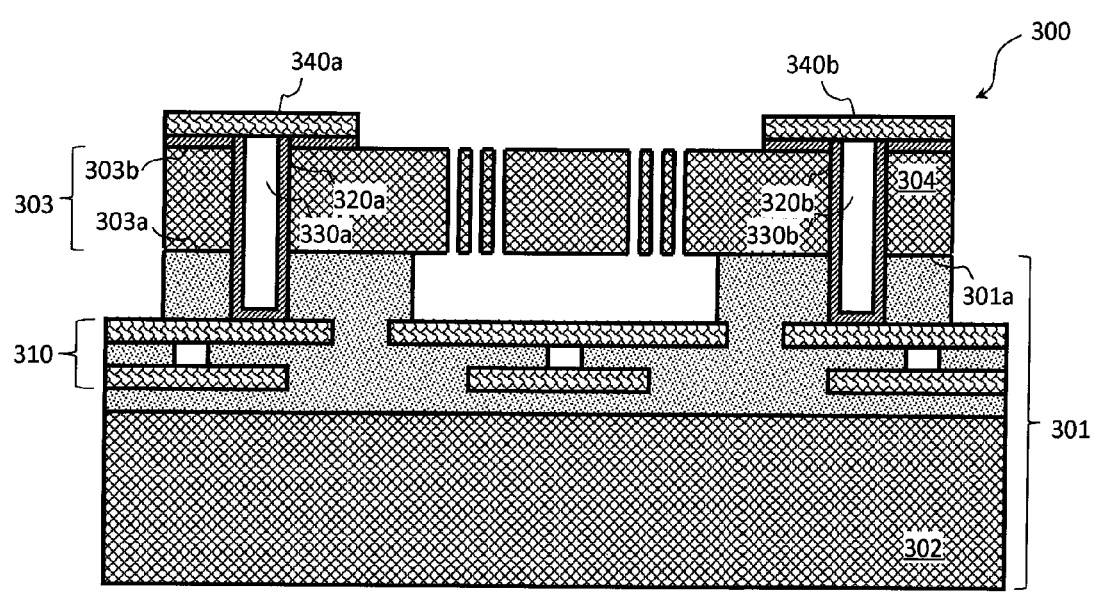

In some embodiments, the at least one germanium-containing layer can extend over a surface of the second substrate structure. For example, germanium-containing layers 320a and 320b can extend over a surface 303b of a substrate structure 303 as shown in FIG. 3. Items of FIG. 3 that are the same or similar items in FIG. 2 are indicated by the same reference numerals, increased by 100. The surface 303b is opposite to a surface 303a of the substrate structure 303, which is bonded with a substrate structure 301. In some embodiments, the germanium-containing layers 320a and 320b can each horizontally extend toward and/or against each other.

In some embodiments, the germanium-containing layers 320a and 320b can be undoped or doped with N-type and/or P-type dopants. In other embodiments, surfaces of the substrate 304 that adjoins the germanium-containing layers 320a and 320b can be doped with N-type and/or P-type dopants.

In some embodiments, the package system 300 can include at least one metallic material, e.g., metallic materials 340a and 340b, which are disposed over the germanium-containing layers 320a and 320b, respectively. The metallic materials 340a and 340b can be electrically coupled with the germanium-containing layers 320a and 320b and the conductive structures 330a and 330b, respectively. The metallic materials 340a-340b can provide an electrical connection between the conductive structure 310 and another conductive structure (not shown) that may be disposed on and/or over the surface 303b.

In some embodiments, the metallic materials 340a and 340b can be made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable bonding materials, and/or any combinations thereof. In other embodiments, the sidewalls (not labeled) of the metallic materials 340a and 340b can be substantially aligned with sidewalls (not labeled) of the germanium-containing layers 320a and 320b, respectively. In still other embodiments, the sidewalls (not labeled) of the metallic materials 340a and 340b can be misaligned from the sidewalls (not labeled) of the germanium-containing layers 320a and 320b, respectively.

In some embodiments, the least one germanium-containing layer can be disposed around a portion of the at least one second conductive structure that is adjacent to a first surface of the second substrate structure. The first surface is opposite to a second surface of the second substrate structure which is bonded with the first substrate structure. The least one germanium-containing layer is separated from the at least one first conductive structure.

Figure 4:
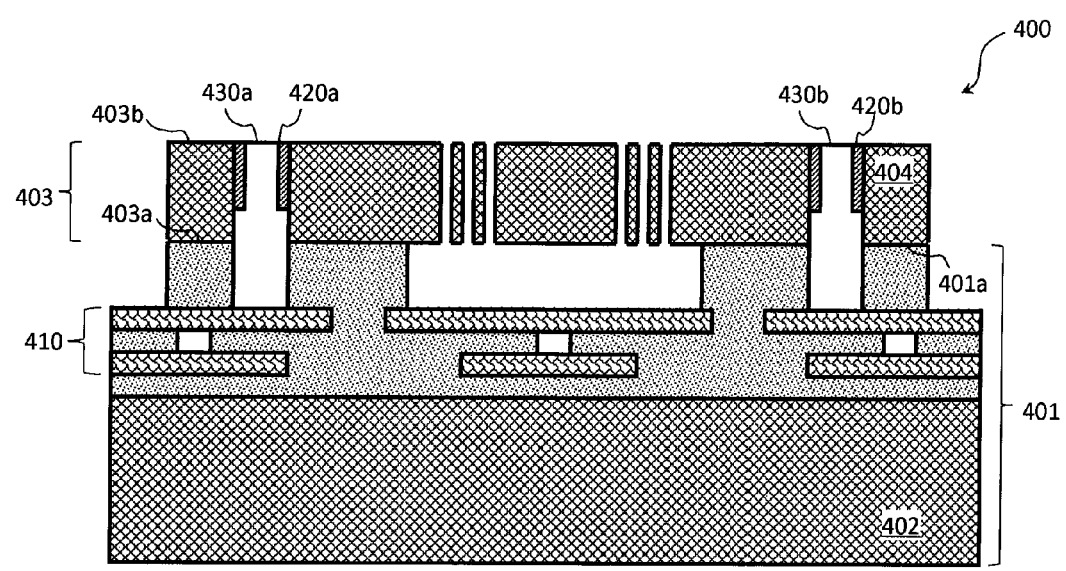

For example, germanium-containing layers 420a and 420b can be disposed around a portion of conductive structure 430a and 430b, respectively, as shown in FIG. 4. Items of FIG. 4 that are the same or similar items in FIG. 2 are indicated by the same reference numerals, increased by 200. In some embodiments, the portions of the conductive structure 430a and 430b are adjacent to a surface 403b of a substrate structure 403. The surface 403b is opposite to a surface 403a of the substrate structure 403, which is bonded with a substrate structure 401.

In some embodiments, the germanium-containing layer 420a can be separated from a conductive structure 410. In other embodiments, the germanium-containing layer 420a can extend into the substrate structure 401 and be separated from the conductive structure 410.

In some embodiments, the germanium-containing layers 420a and 420b can have surfaces (not labeled) that can be substantially leveled with the surface 403b of the substrate structure 403. In other embodiments, the surfaces of the germanium-containing layers 420a and 420b can be lower or higher than the surface 403b.

In some embodiments, the conductive structure 430a can be made of AlCu and/or Ti and the substrate 404 is a silicon substrate. The Schottky barrier height between the germanium-containing layer 420a and the AlCu/Ti conductive structure 430a can be lower than that between the silicon substrate 404 and the AlCu/Ti conductive structure 430a. The interface between the germanium-containing layer 420a and the AlCu/Ti conductive structure 430a is lower than that between the silicon substrate 404 and the AlCu/Ti conductive structure 430a. The current flowing through the interface between the germanium-containing layer 420a and the AlCu/Ti conductive structure 430a can be larger than that between the silicon substrate 404 and the AlCu/Ti conductive structure 430a.

Figure 5:
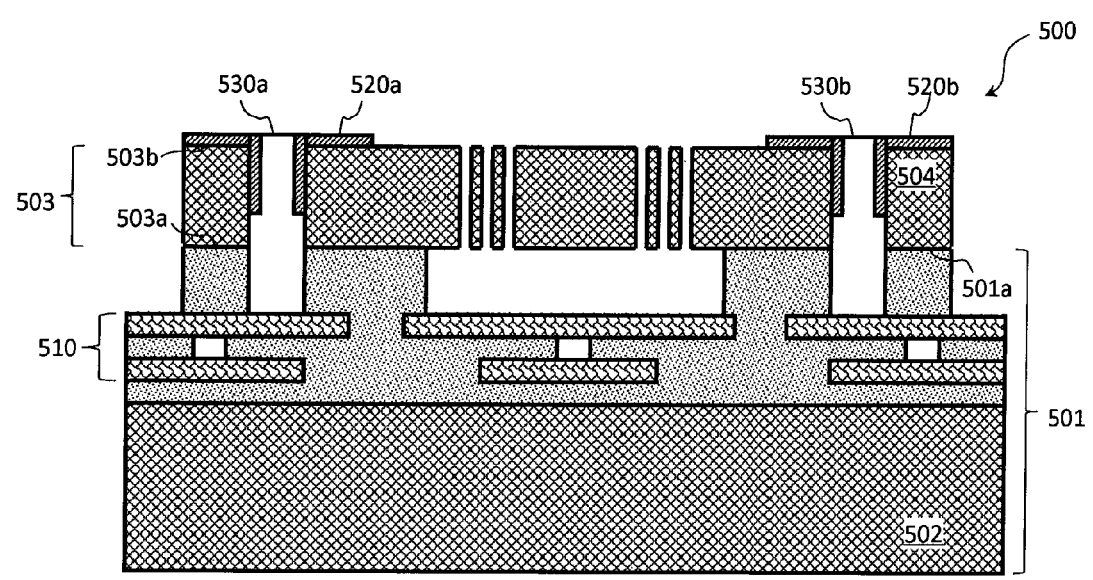

In some embodiments, the at least one germanium-containing layer that is separated from the at least one first conductive structure can further extend over a surface of the second substrate structure. For example, germanium-containing layers 520a and 520b can extend over a surface 503b of a substrate structure 503 as shown in FIG. 5. Items of FIG. 5 that are the same or similar items in FIG. 4 are indicated by the same reference numerals, increased by 100. In other embodiments, the germanium-containing layers 520a and 520b can each horizontally extend toward and/or away from each other. In still other embodiments, the germanium-containing layers 520a and 520b can extend into the substrate structure 501 and be separated from the conductive structure 510.

In some embodiments, metallic materials that are as same as or similar to the metallic materials 340a and 340b described above in conjunction with FIG. 3 can be applied to the package systems 400 and 500 described above in conjunction with FIGS. 4 and 5, respectively. The metallic materials can be disposed over the germanium-containing layers 420a-420b and 520a-520b. The metallic materials can provide an electrical connection between the conductive structure and another conductive structure (not shown) that may be disposed on and/or over the surface.

Figure 6:
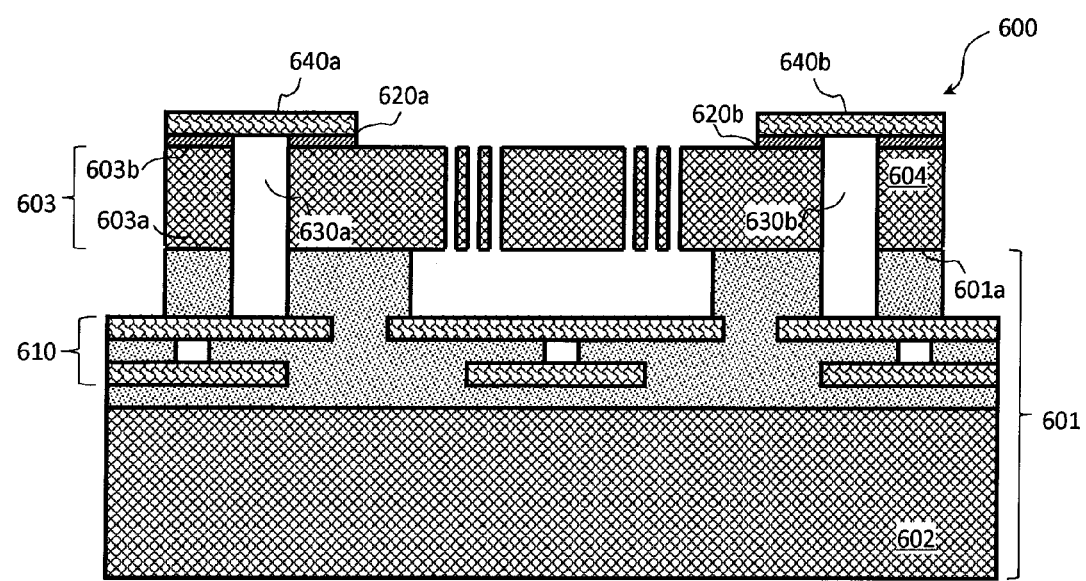

In some embodiments, at least one second conductive structure can be disposed through the second substrate structure and electrically coupled with the at least one first conductive structure. The at least one germanium-containing layer is disposed over and electrically coupled with the second substrate. For example, conductive structures 630a and 630b can be disposed through a substrate structure 603 and electrically coupled with a conductive structure 610 as shown in FIG. 6. Items of FIG. 6 that are the same or similar items in FIG. 3 are indicated by the same reference numerals, increased by 300. Germanium-containing layers 620a and 620b can be disposed over and electrically coupled with the substrate 604. The germanium-containing layers 620a and 620b can be electrically coupled with the conductive structure 610 through the conductive structures 630a and 630b, respectively.

In some embodiments, the germanium-containing layers 620a and 620b can be disposed around portions of the conductive structures 630a and 630b, respectively. The portions of the germanium-containing layers 620a and 620b can be adjacent to a surface 603b of the substrate structure 603.

In some embodiments, the conductive structure 630a can be made of AlCu and/or Ti and the substrate 604 is a silicon substrate. The Schottky barrier height between the germanium-containing layer 620a and the AlCu/Ti conductive structure 630a can be lower than that between the silicon substrate 604 and the AlCu/Ti conductive structure 630a. The interface between the germanium-containing layer 620a and the AlCu/Ti conductive structure 630a is lower than that between the silicon substrate 604 and the AlCu/Ti conductive structure 630a. A desired amount of current can flow from the conductive structure 610 through the conductive structure 630a through the germanium-containing layer 620a to the substrate 604.

In some embodiments, the package system 600 can include at least one metallic material, e.g., metallic materials 640a and 640b, which are disposed over the germanium-containing layers 620a and 620b, respectively. The metallic materials 640a and 640b can be electrically coupled with the germanium-containing layers 620a and 620b and the conductive structures 630a and 630b, respectively. The metallic materials 640a-640b can provide an electrical connection between the conductive structure 610 and another conductive structure (not shown) that may be disposed on and/or over the surface 603b.

Figure 7:
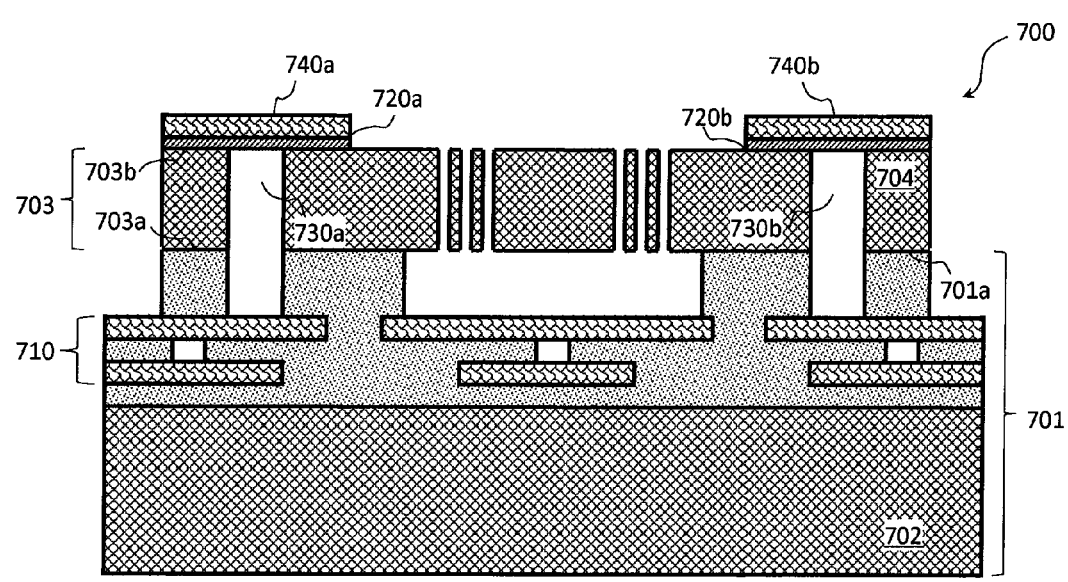

In some embodiments, the least one germanium-containing layer can be directly disposed on the at least one conductive structure. For example, germanium-containing layers 720a and 720b can be directly disposed on conductive structures 730a and 730b as shown in FIG. 7. Items of FIG. 7 that are the same or similar items in FIG. 6 are indicated by the same reference numerals, increased by 100. The germanium-containing layers 720a and 720b can be electrically coupled with the conductive structure 710 through the conductive structures 730a and 730b, respectively.

In some embodiments, the package system 700 can include at least one metallic material, e.g., metallic materials 740a and 740b, which are disposed over the germanium-containing layers 720a and 720b, respectively. The metallic materials 740a and 740b can be electrically coupled with the germanium-containing layers 720a and 720b and the conductive structures 730a and 730b, respectively. The metallic materials 740a-740b can provide an electrical connection between the conductive structure 710 and another conductive structure (not shown) that may be disposed on and/or over the surface 703b.

In some embodiments, a package system can include a first substrate structure including at least one first conductive structure that is disposed over a first substrate. A second substrate structure can include a second substrate. The second substrate structure can be bonded with the first substrate structure. The second substrate structure can have at least one doped region. At least one second conductive structure can be disposed through the second substrate structure. The second substrate can be electrically coupled with the at least one first conductive structure through the at least one doped region.

Figure 8:
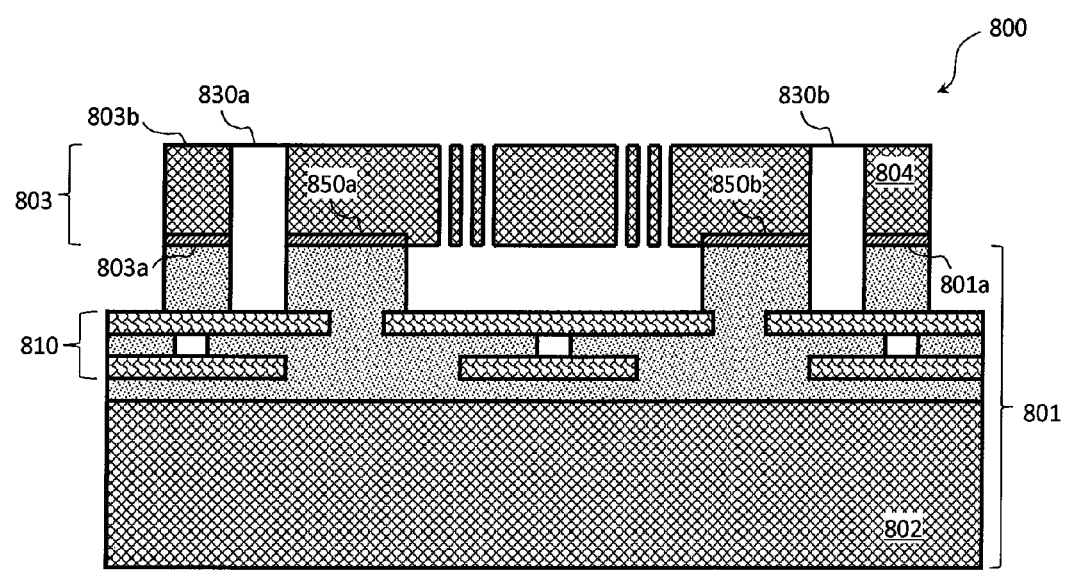

For example, a package system 800 can include a substrate structure 801 including at least one conductive structure, e.g., a conductive structure 810 as shown in FIG. 8. Items of FIG. 8 that are the same or similar items in FIG. 2 are indicated by the same reference numerals, increased by 600. A substrate structure 803 can be bonded with the substrate structure 801. The substrate structure 803 can have at least one doped region, e.g., doped regions 850a and 850b. At least one conductive structure, e.g., conductive structures 830a and 830b, can be disposed through the substrate structure 803. The substrate 804 can be electrically coupled with the conductive structures 810 through the doped region 850a and 830a.

In some embodiments, the doped region 850a and 850b can be disposed in a surface 803a of the substrate structure 803, which is bonded with the substrate structure 801. In other embodiments, the doped regions 850a and 850b can be disposed around portions of the conductive structures 830a and 830b, respectively. The portions of the conductive structures 830a and 830b can be adjacent to a surface 803a of the substrate structure 803.

As noted, the doped regions 850a and 850b can be doped with N-type and/or P-type dopants. The dopants in the doped regions 850a and 850b can lower the Schottky barrier height between the conductive structures 830a and 830b and the substrate 804. The Schottky barrier height between the doped regions 850a-850b and the conductive structures 830a and 830b, respectively, is lower than that between the substrate 804 and the conductive structures 830a and 830b. The resistance between the interfaces of the doped regions 850a-850b and the conductive structures 830a and 830b, respectively, is lower than that between the substrate 804 and the conductive structures 830a and 830b. A desired amount of current can flow from the conductive structure 810 through the conductive structures 830a and 830b through the doped regions 850a and 850b to the substrate 804.

Figure 9:
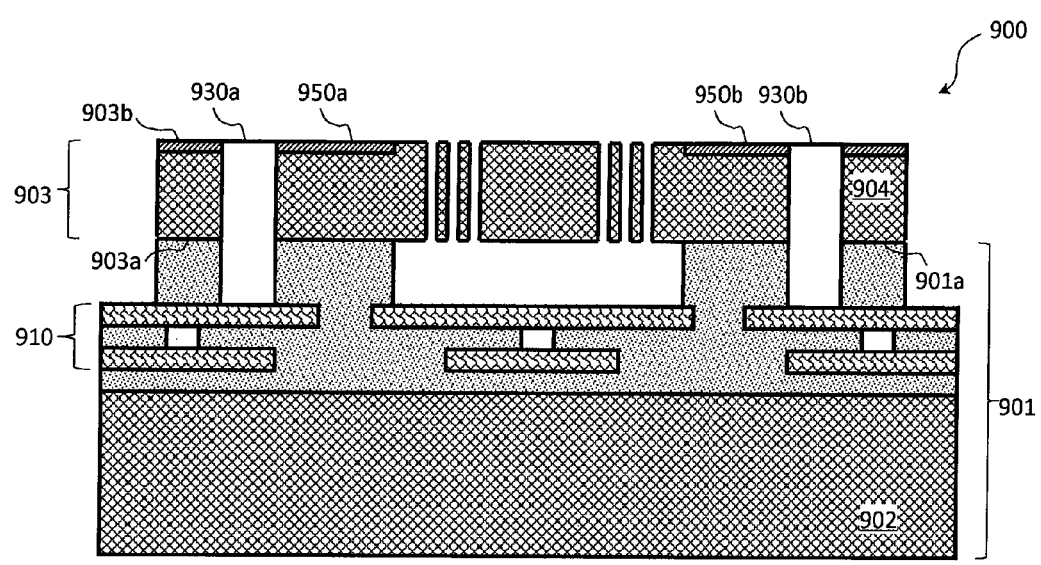

In some embodiments, the at least one doped region can be disposed in a first surface of the second substrate structure and the first surface is opposite to a second surface of the second substrate structure that is bonded with the first substrate structure. For example, doped regions 950a and 950b can be disposed in a surface 903b of a substrate structure 903 as shown in FIG. 9. Items of FIG. 9 that are the same or similar items in FIG. 8 are indicated by the same reference numerals, increased by 100.

In some embodiments, the doped regions 950a and 950b can be disposed around portions of the conductive structures 930a and 930b, respectively. The portions of the conductive structures 930a and 930b can be adjacent to a surface 903b of the substrate structure 903.

Figure 10:
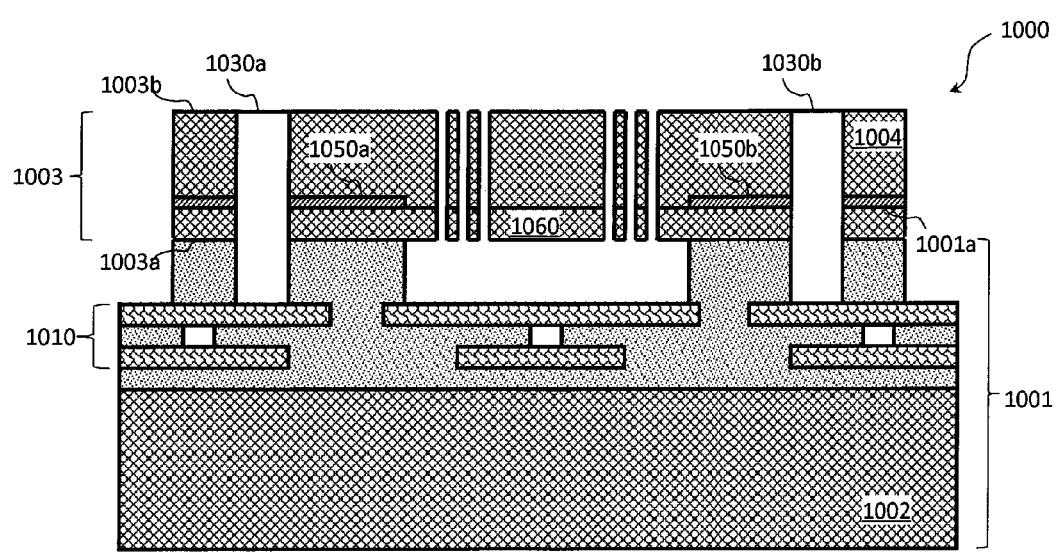

In some embodiments, the second substrate structure comprises at least one silicon-containing layer disposed adjacent to the doped region. The at least one silicon-containing layer is bonded with the first substrate structure. For example, a substrate structure 1003 can include at least one silicon-containing layer, e.g., a silicon-containing layer 1060, that is disposed adjacent to doped region 1050a and 1050b as shown in FIG. 10. The silicon-containing layer 1060 can be bonded with a substrate structure 1001. Items of FIG. 10 that are the same or similar items in FIG. 8 are indicated by the same reference numerals, increased by 200.

In some embodiments, the silicon-containing layer 1060 can be made of at least one material including, for example, polysilicon, epitaxial silicon, amorphous, SiGe, other semiconductor materials, and/or any combinations thereof. In some embodiments, the doped regions 1050a and 1050b can be disposed around portions of the conductive structures 1030a and 1030b, respectively. The portions of the conductive structures 1030a and 1030b can be adjacent to a surface between the substrate 1004 and the silicon-containing layer 1060.

It is noted that the doped regions 850a-850b, 950a-950b and 1050a-1050b described above in conjunction with FIGS. 8-10, respectively, are merely exemplary. In some embodiments, a package system can include at least two different layers of the dopes regions 850a-850b, 950a-950b and 1050a-1050b for providing electrical coupling between the conductive structure and the substrate structure.

Figure 11:
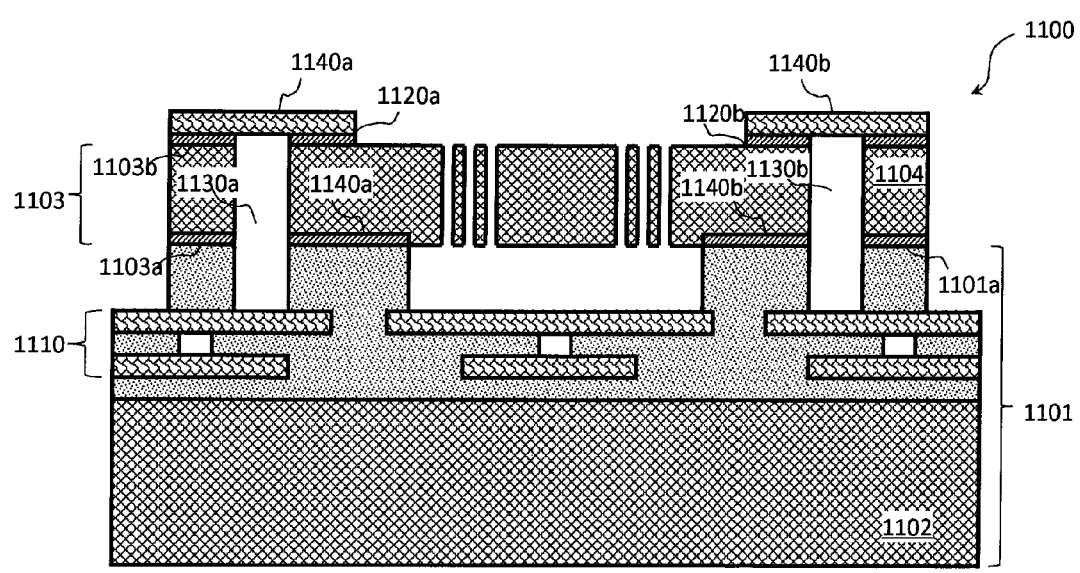

It is also noted that in some embodiments at least one of the doped regions 850a-850b, 950a-950b and 1050a-1050b described above in conjunction with FIGS. 8-10, respectively, can be applied to the package systems 100-700 described above in conjunction with FIGS. 1-7. For example, a package system 1100 can include at least one doped region, e.g., doped regions 1140a and 1140b in a surface 1103a of a substrate structure 1103. Items of FIG. 11 that are the same or similar items in FIG. 3 are indicated by the same reference numerals, increased by 800. The doped regions 1140a and 1140b can be as same as or similar to the doped regions 850a and 850b, respectively, described above in conjunction with FIG. 8.

Figure 12:
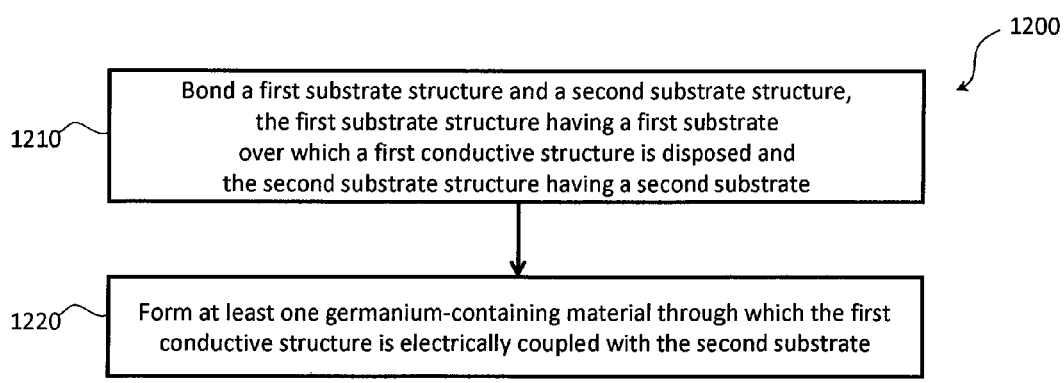
FIG. 12 is a flowchart illustrating an exemplary method of forming a package system including at least one germanium-containing layer.

Following are descriptions related to methods of forming exemplary package systems. Illustrated in FIG. 12 is a flowchart of an exemplary method of forming a package system. FIGS. 13A-13E are schematic cross-sectional views of package systems during various fabrication stages. Items of FIGS. 13A-13E that are the same or similar items in FIG. 1 are indicated by the same reference numerals, increased by 1200. It is understood that FIGS. 13A-13E have been simplified for a better understanding of the concepts of the present disclosure. Accordingly, it should be noted that additional processes may be provided before, during, and after the method of FIG. 12, and that some other processes may only be briefly described herein.

Referring to FIG. 12, a method 1200 of forming a package system can include bonding a first substrate structure and a second substrate structure (block 1210). The first substrate structure can have a first substrate over which a first conductive structure is disposed. The second substrate structure can have a second substrate. The method 1200 can also include forming at least one germanium-containing material through which the first substrate structure is electrically coupled with the second substrate structure (block 1220).

Figure 13A:
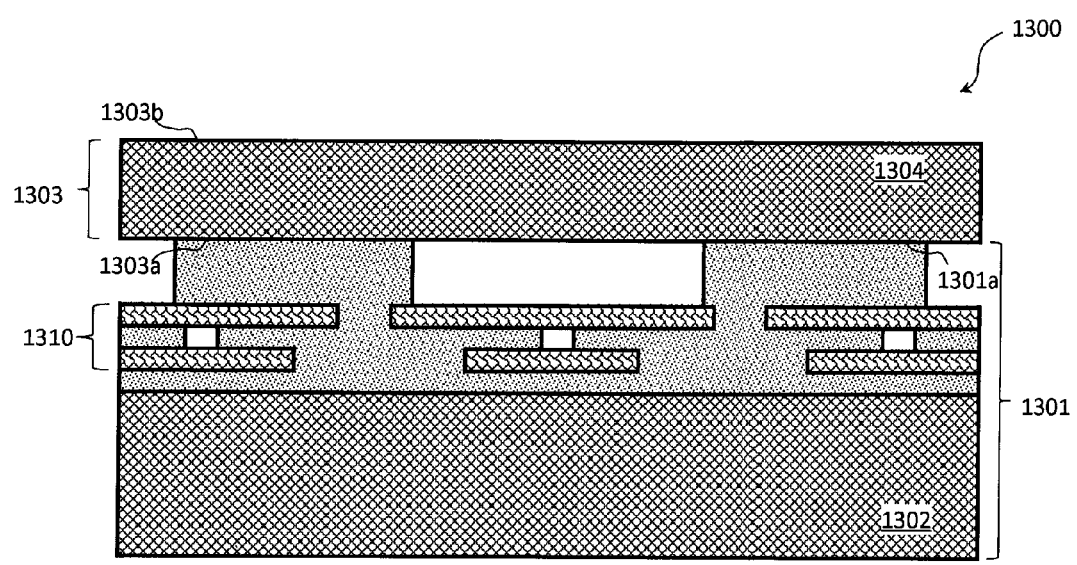
FIGS. 13A-13E are schematic cross-sectional views of package systems during various fabrication stages.

For example, the block 1210 can include bonding a substrate structure 1301 and another substrate structure 1303 as shown in FIG. 13A. The substrate structure 1301 can include a substrate 1302 over which a conductive structure 1310 can be disposed. The substrate structure 1303 can include a substrate 1304. The substrate structures 1301 and 1303 can be bonded by, for example, a fusion bonding method.

Figure 13B:
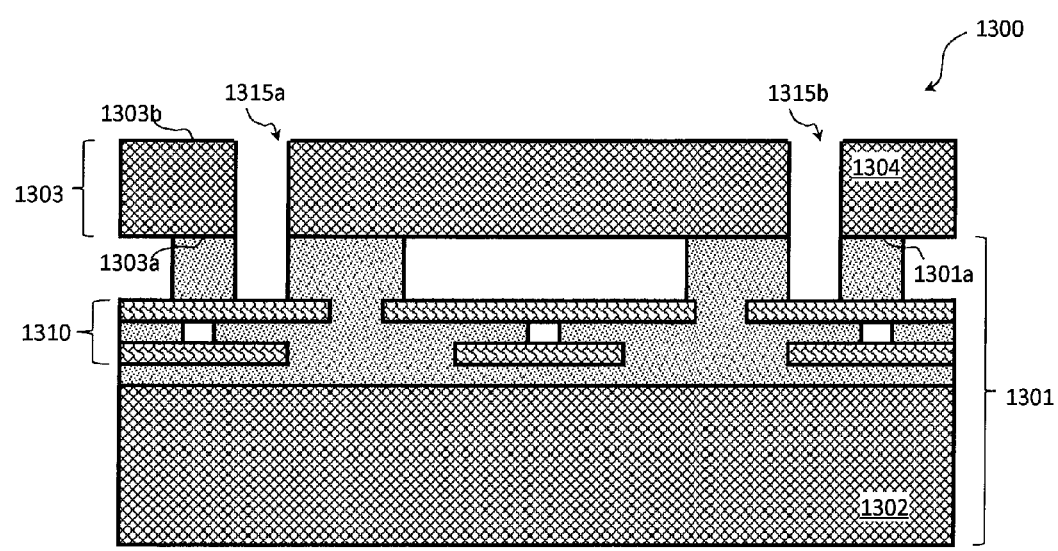

Referring to FIGS. 12 and 13B, the block 1220 can include forming at least one germanium-containing material through which the first conductive structure is electrically coupled with the second substrate. In some embodiments, the block 1220 can include an etch process removing portions of the first and second substrate structures 1301 and 1303, forming at least one opening, e.g., openings 1315a and 1315b, through the substrate structure 1303. In other embodiments, the etch process can also remove portions of the substrate structure 1301 as shown in FIG. 13B.

Figure 13C:
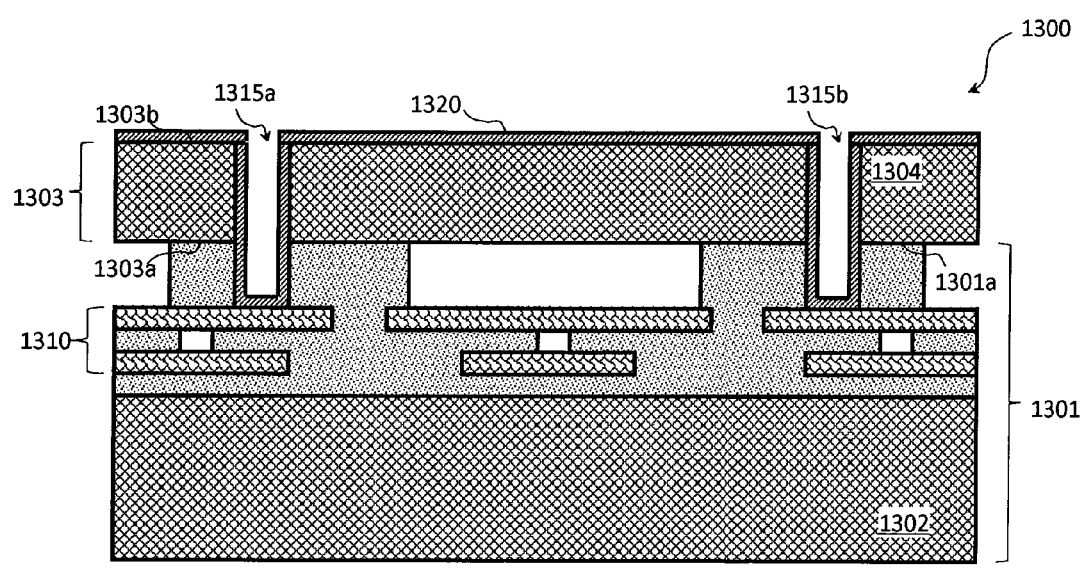

In some embodiments, the block 1220 can include forming at least one germanium-containing material, e.g., a germanium-containing material 1320, substantially conformal over the structure as shown in FIG. 13C. In some embodiments, the germanium-containing material 1320 can be formed by a low pressure chemical vapor deposition (LPCVD) process.

Figure 13D:
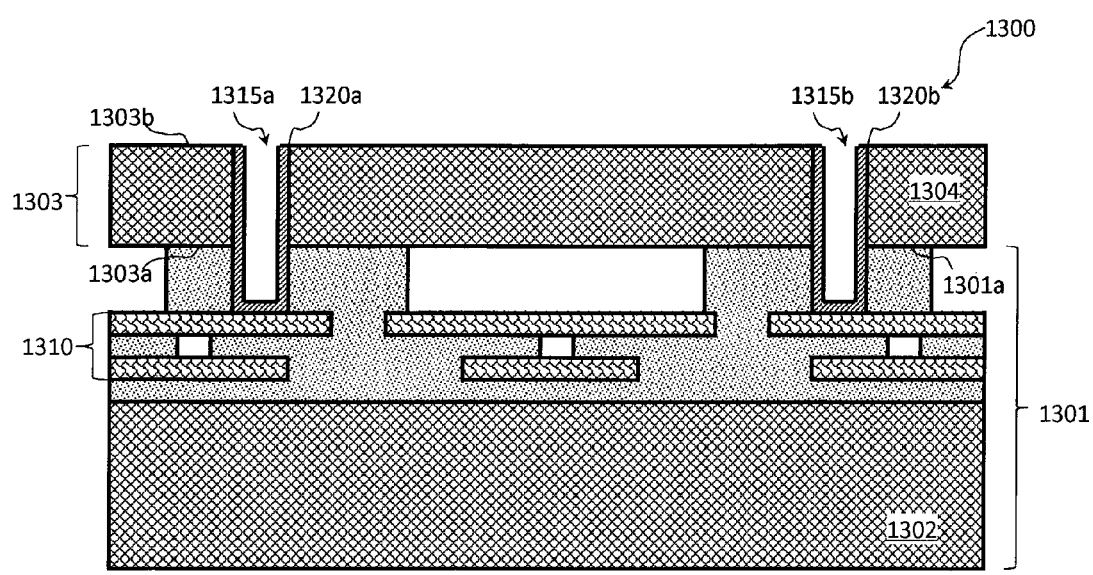

In some embodiments, the block 1220 can include a removing process removing at least a portion of the germanium-containing material 1320. For example, the removing process can remove a portion of the germanium-containing material 1320 that is over the surface 1303b of the substrate structure 1303 as shown in FIG. 13D.

Figure 13E:
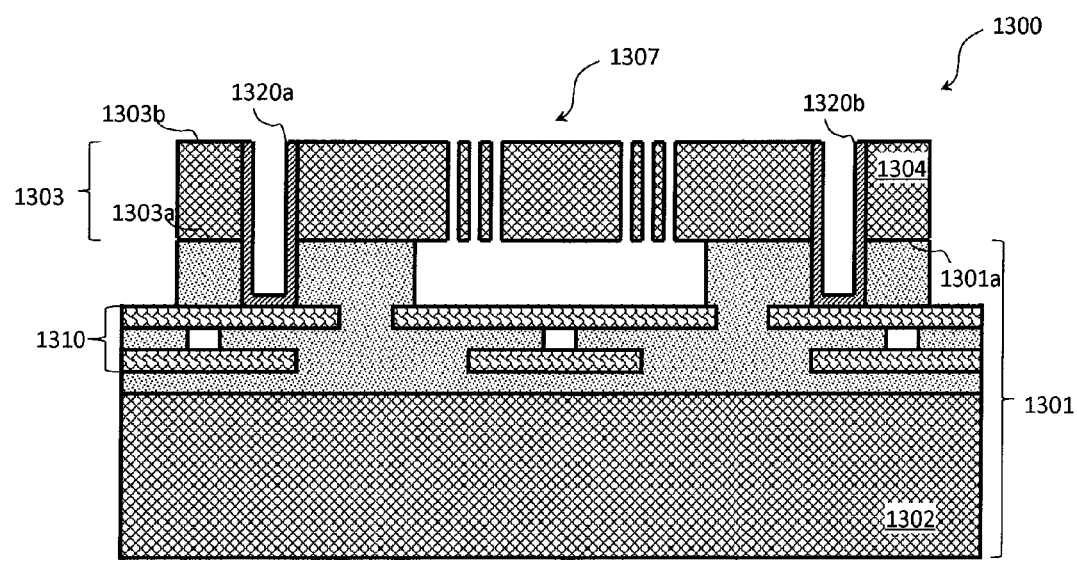

In some embodiments, the method 1200 can include a removing process removing at least one portion of the substrate structure 1303 to expose the conductive structure 1310 as shown in FIG. 13E. The exposed conductive structure 1310 can serve for electrical bonding, e.g., wire bonding. In some embodiments, the method 1200 can further include forming at least one MEMS device, e.g., a MEMS device 1307, in the substrate structure 1303 as shown in FIG. 13E. In other embodiments, forming the MEMS device 1307 can be before or after removing the portion of the substrate structure 1303.

Figure 14:
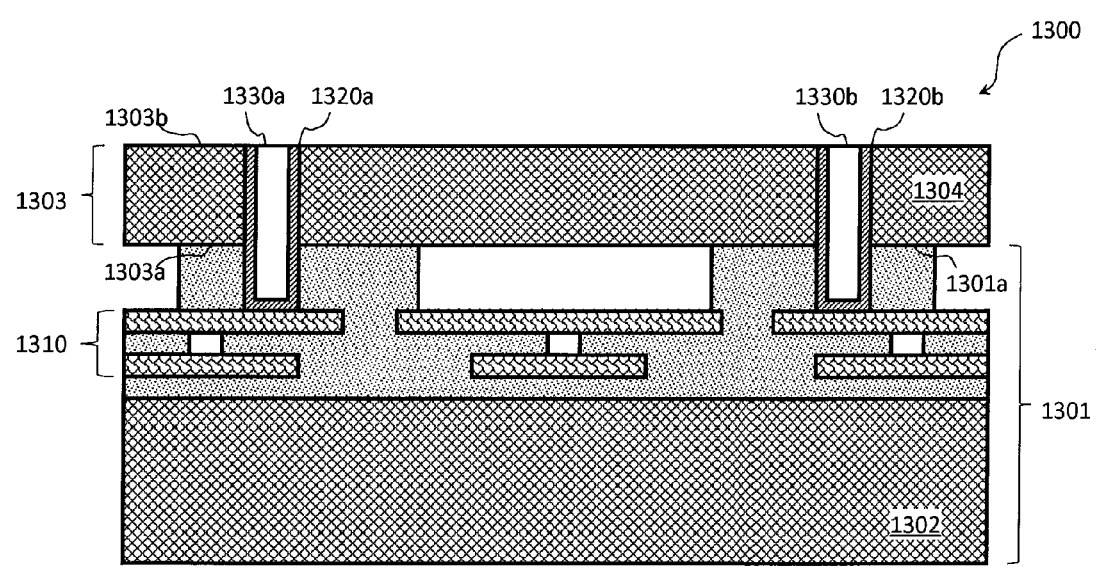
FIG. 14 is a cross-sectional view illustrating a fabrication stage of an exemplary method of forming a package system.

In some embodiments, after removing a portion of the germanium-containing material 1320 (shown in FIG. 13D), at least one conductive structure, e.g., conductive structures 1330a and 1330b, can be formed within the openings 1315a and 1315b, respectively, as shown in FIG. 14. The conductive structures 1330a and 1330b can be formed, for example, by physical vapor deposition (PVD), CVD, plating, and/or any combinations thereof. After forming the conductive structures 1330a and 1330b, the method of forming the package system can proceed as shown in FIG. 13E to remove a portion of the substrate structure 1303 and/or form the MEMS device 1307. The structure can be similar to the structure shown in FIG. 2.

In other some embodiments, after forming the germanium-containing material 1320 (shown in FIG. 13C), a conductive material (not shown) can be formed in the openings 1315a and 1315b and over the germanium-containing material 1320. The conductive material and the germanium-containing material 1320 are subjected to a removing process, e.g., a chemical mechanical polish (CMP) process. The CMP process can remove portions of the conductive material and the germanium-containing material 1320 so as to form the structure shown in FIG. 14. After forming the conductive structures 1330a and 1330b, the method of forming the package system can proceed as shown in FIG. 13E to remove a portion of the substrate structure 1303 and/or form the MEMS device 1307. The structure can be similar to the structure shown in FIG. 2.

Figure 15A:
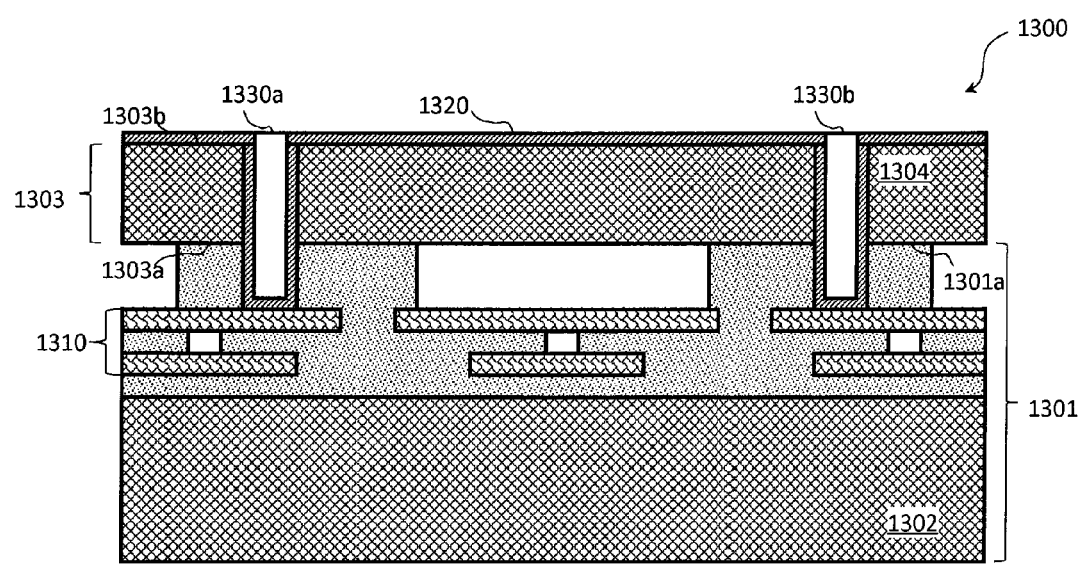
FIGS. 15A-15C are schematic cross-sectional views of package systems during various fabrication stages.
Figure 15B:
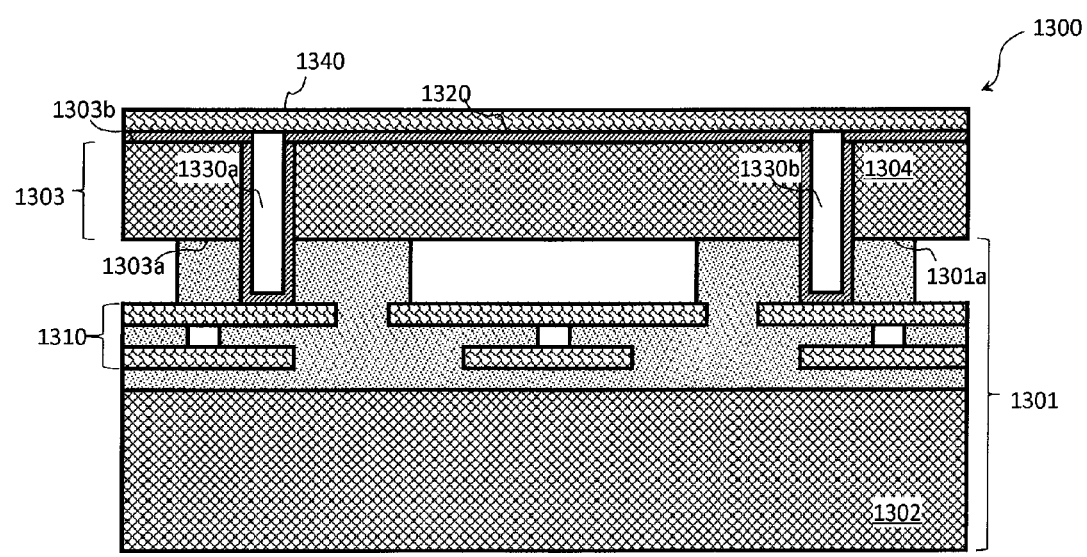
Figure 15C:
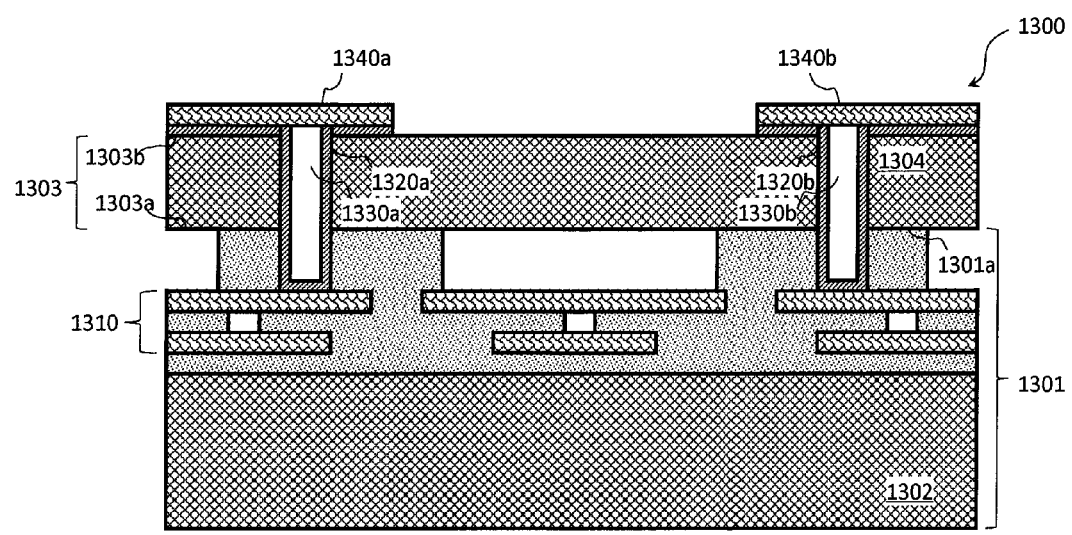

In some embodiments, after forming the germanium-containing material 1320 (shown in FIG. 13C), the conductive structures 1330a and 1330b, can be formed within the openings 1315a and 1315b, respectively, as shown in FIG. 15A. After forming the conductive structures 1330a and 1330b, a metallic material 1340 can be formed over the germanium-containing material 1320 as shown in FIG. 15B. A lithographic process and an etch process then can remove a portion of the metallic material 1340 and a portion of the germanium-containing material 1320, such that metallic materials 1340a-1340b and germanium-containing layers 1320a-1320b can be formed over the surface 1303b of the substrate structure 1303 as shown in FIG. 15C. Thereafter, the method can proceed as shown in FIG. 13E to remove a portion of the substrate structure 1303 and/or form the MEMS device 1307. The structure achieved can be similar to the structure shown in FIG. 3.

Figure 16:
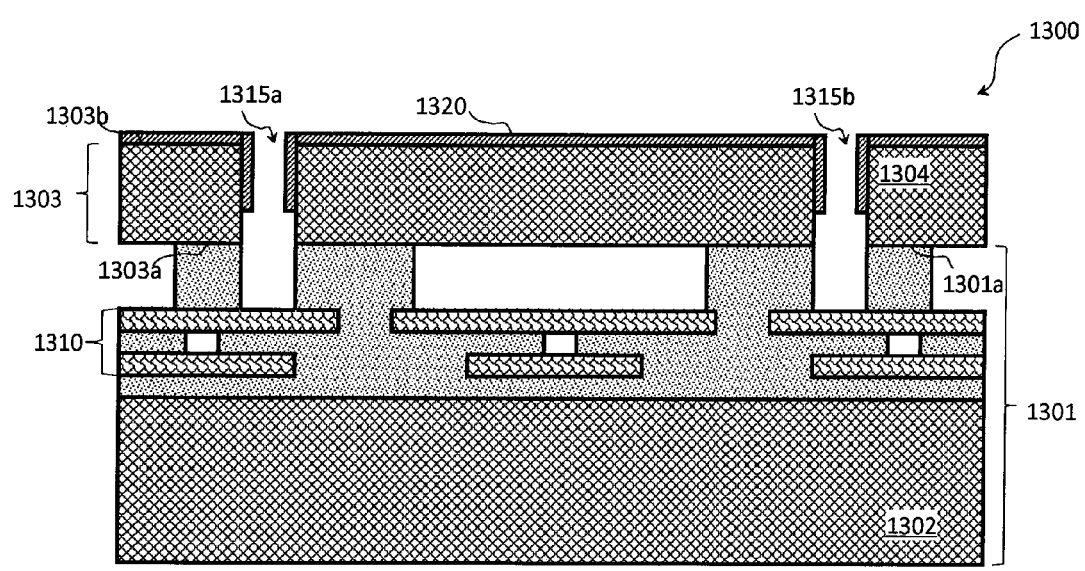
FIG. 16 is a cross-sectional view illustrating a fabrication stage of an exemplary method of forming a package system.

In some embodiments, after forming the openings 1315a and 1315b (shown in FIG. 13B), the germanium-containing material 1320 can be formed on the surface 1303b and partially on sidewalls of the openings 1315a and 1315b as shown in FIG. 16. The germanium-containing material 1320 can be formed by, for example, a sputtering process. Due to the non-conformal nature of sputtering, the germanium-containing material 1320 can be formed merely on the top sidewalls of the openings 1315a and 1315b. After forming the non-conformal germanium-containing material 1320, the method can proceed to perform the processes described above in conjunction with FIGS. 13D-13E. The structure achieved can be similar to the structure shown in FIG. 4.

In other embodiments, after the non-conformal germanium-containing material 1320 described above in conjunction with FIG. 16 is formed, a conductive material (not shown) can be formed in the openings 1315a and 1315b and over the germanium-containing material 1320. The conductive material and the germanium-containing material 1320 are subjected to a removal process, e.g., a chemical mechanical polish (CMP) process. The CMP process can remove portions of the conductive material and the germanium-containing material 1320 that are over the surface 1303b. After forming the conductive structures 1330a and 1330b, the method of forming the package system can proceed as shown in FIG. 13E to remove a portion of the substrate structure 1303 and/or form the MEMS device 1307. The structure can be similar to the structure shown in FIG. 5.

FIGS. 17A-17G are schematic cross-sectional views of package systems during various fabrication stages. Items of FIGS. 17A-17G that are the same or similar items in FIGS. 13A-13E are indicated by the same reference numerals, increased by 400. It is understood that FIGS. 17A-17G have been simplified for a better understanding of the concepts of the present disclosure. Accordingly, it should be noted that additional processes may be provided before, during, and after the method of FIGS. 17A-17G, and that some other processes may only be briefly described herein.

Figure 17A:
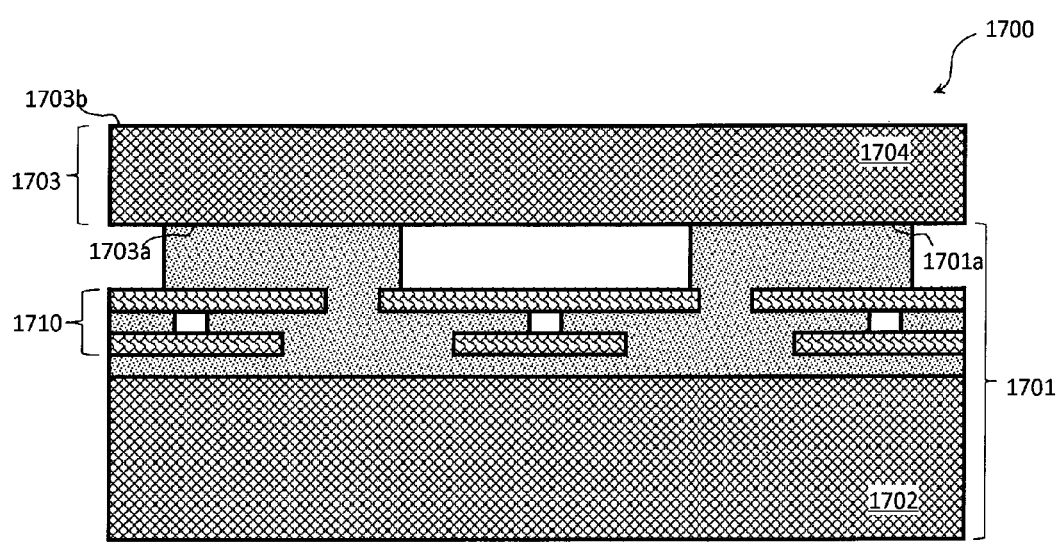
FIGS. 17A-17G are schematic cross-sectional views of package systems during various fabrication stages.

In some embodiments, the block 1210 of the method 1200 can include bonding a substrate structure 1701 and another substrate structure 1703 as shown in FIG. 17A. The substrate structures 1701 and 1703 can be bonded by, for example, a fusion bonding method.

Figure 17B:
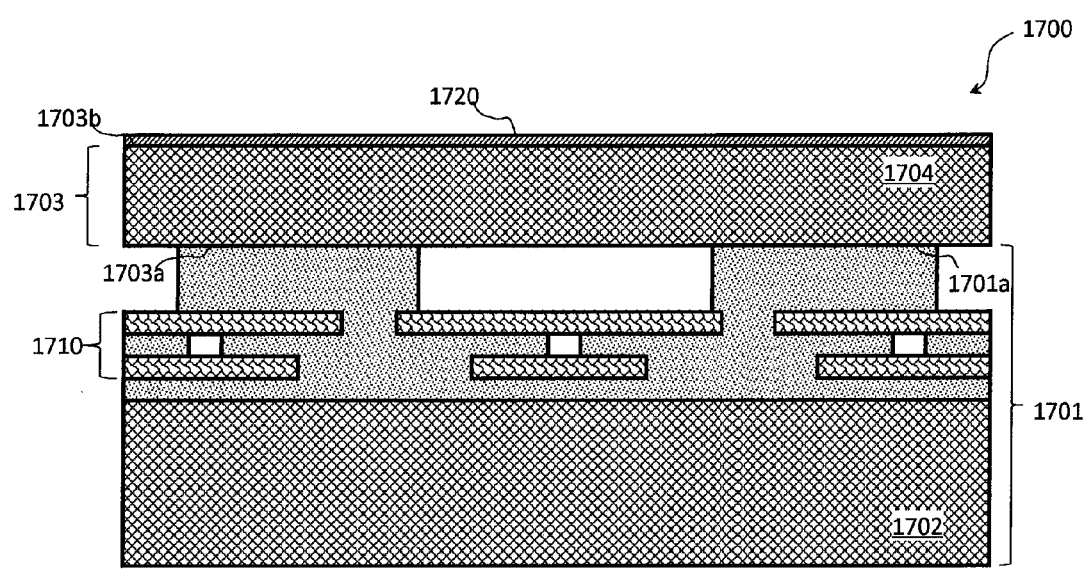

Referring to FIGS. 12 and 17B, the block 1220 can include forming at least one germanium-containing material through which the first conductive structure is electrically coupled with the second substrate. In some embodiments, the block 1220 can include forming at least one germanium-containing material, e.g., a germanium-containing material 1720 over the surface 1703b of the substrate structure 1703.

Figure 17C:
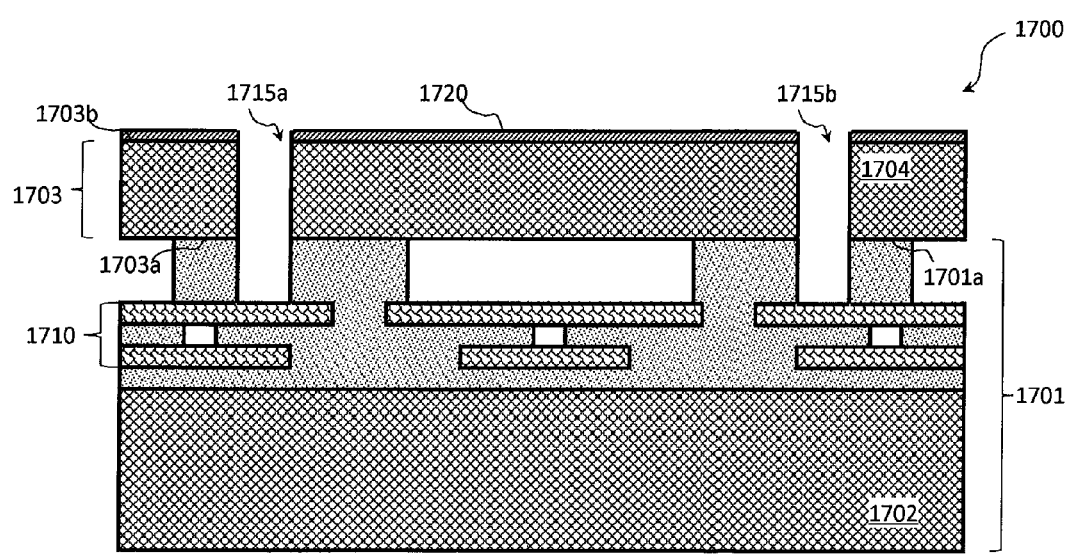

Referring to FIGS. 12 and 17C, the block 1220 can include an etch process forming at least one opening, e.g., openings 1715a and 1715b through the substrate structure 1703 and the germanium-containing material 1720. In other embodiments, the etch process can also remove portions of the substrate structure 1701 as shown in FIG. 17C.

Figure 17D:
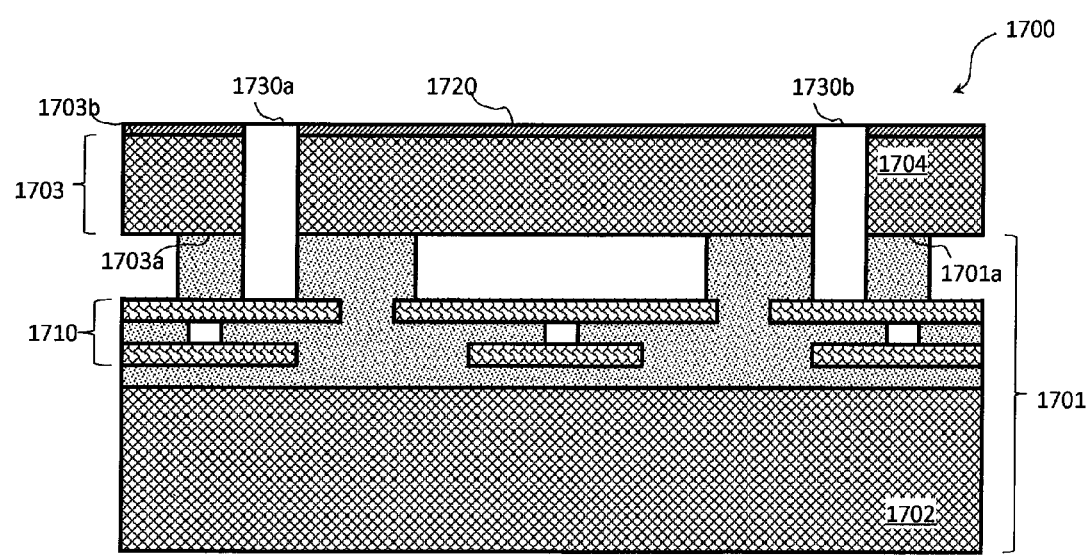
Figure 17E:
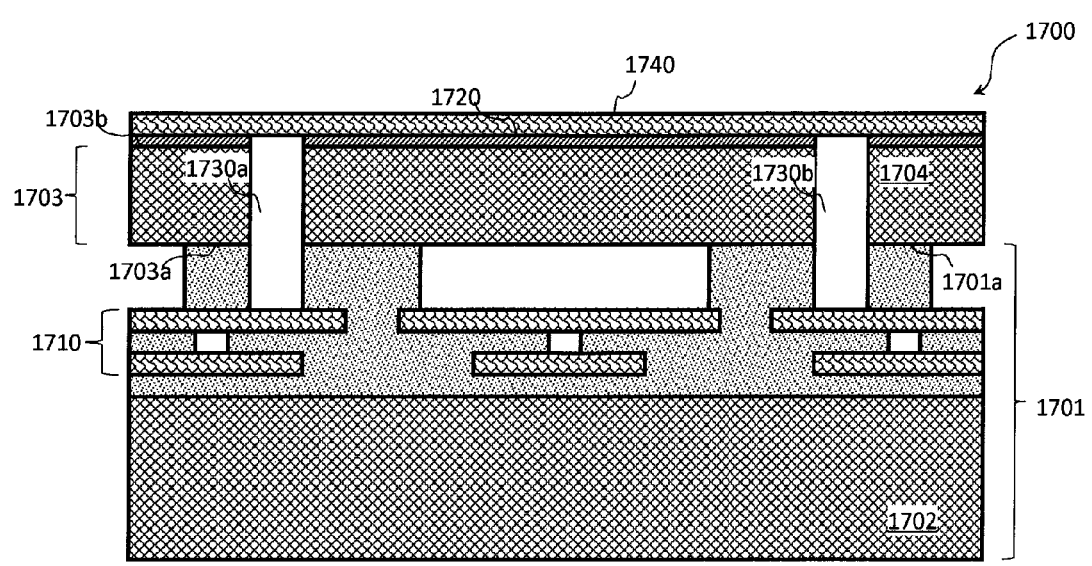

Referring to FIGS. 12 and 17D, the block 1220 can include forming conductive structures 1730a and 1730b within the openings 1715a and 1715b, respectively. After forming the conductive structures 1730a and 1730b, a metallic material 1740 can be formed over the germanium-containing material 1720 as shown in FIG. 17E.

Figure 17F:
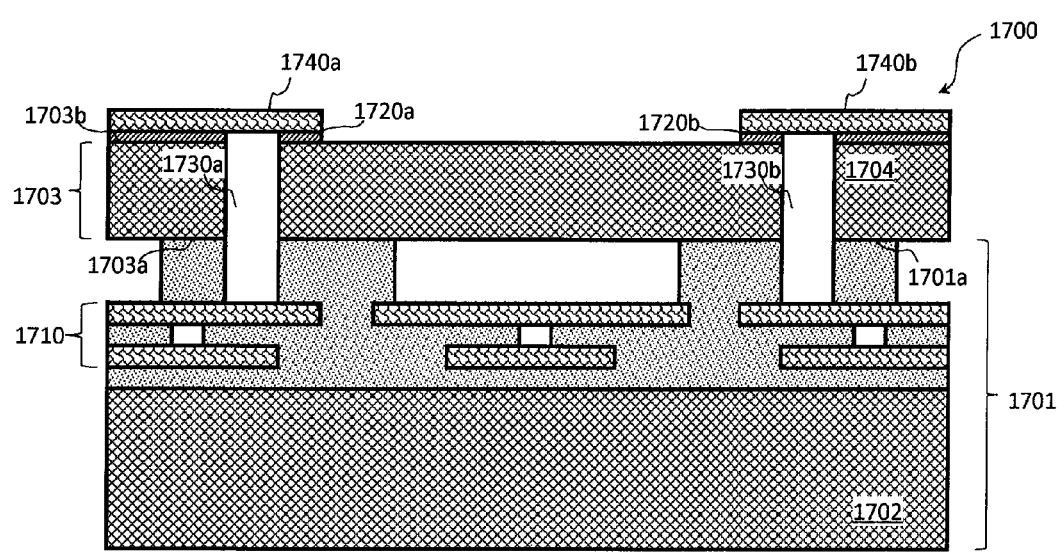

Referring to FIGS. 12 and 17F, the block 1220 can include a lithographic process and an etch process for removing a portion of the metallic material 1740 and a portion of the germanium-containing material 1720, such that metallic materials 1740a-1740b and germanium-containing layers 1720a-1720b can be formed over the surface 1703b of the substrate structure 1703.

Figure 17G:
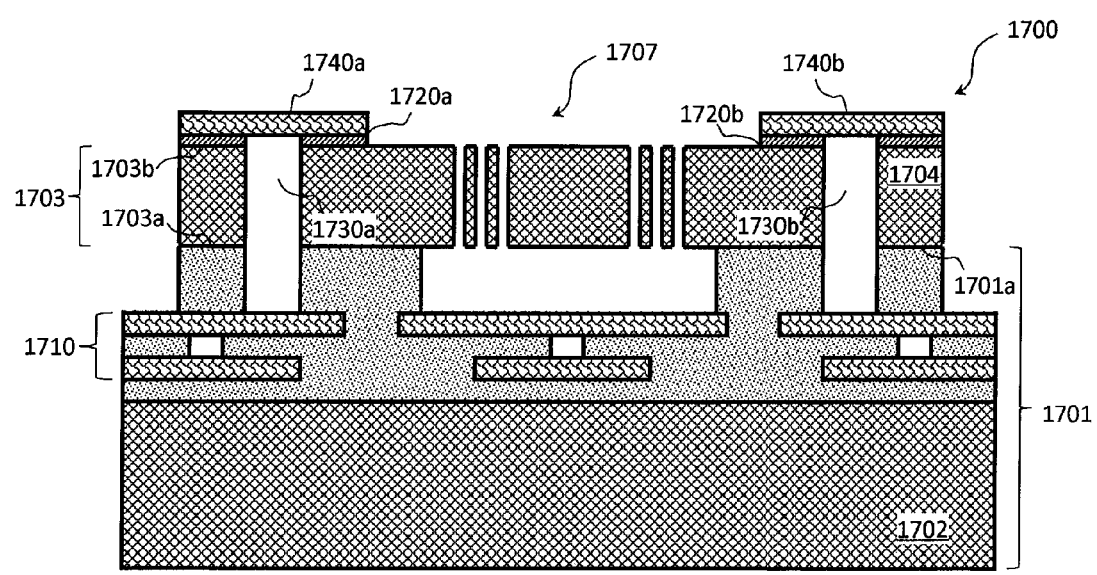

Referring to FIG. 17G, the method 1200 shown in FIG. 12 can remove a portion of the substrate structure 1703 and/or form the MEMS device. The structure achieved can be similar to the structure shown in FIG. 6.

Figure 18:
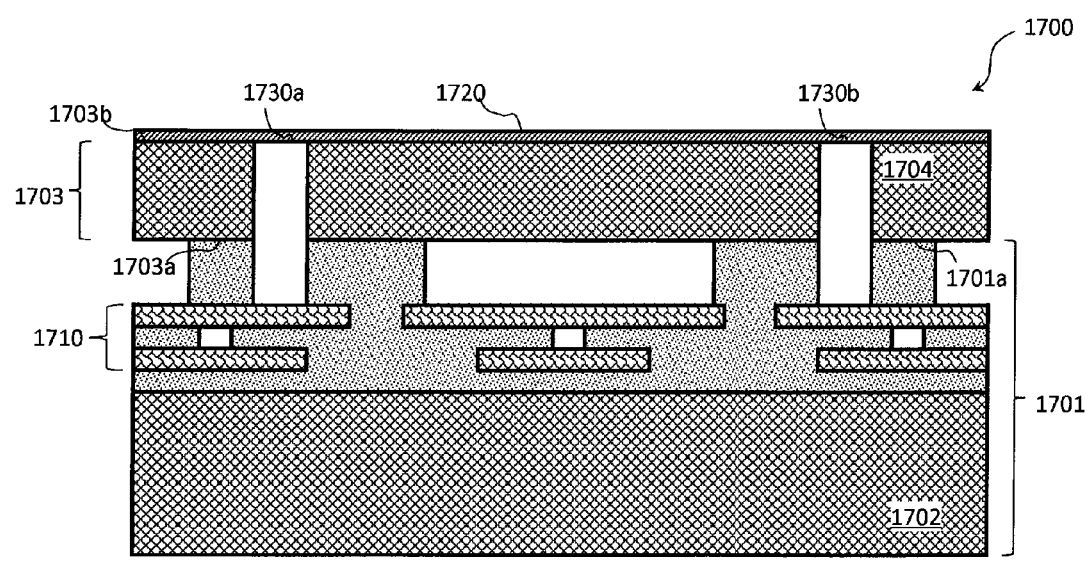
FIG. 18 is a cross-sectional view illustrating a fabrication stage of an exemplary method of forming a package system.

In some embodiments, the germanium-containing material 1720 can be formed after the conductive structures 1730a and 1730b are formed within the openings 1715a and 1715b, respectively, as shown in FIG. 18. Thereafter, the method can proceed to perform the processes described above in conjunction with FIGS. 17E-17G. The structure achieved can be similar to the structure shown in FIG. 7.

Figure 19:
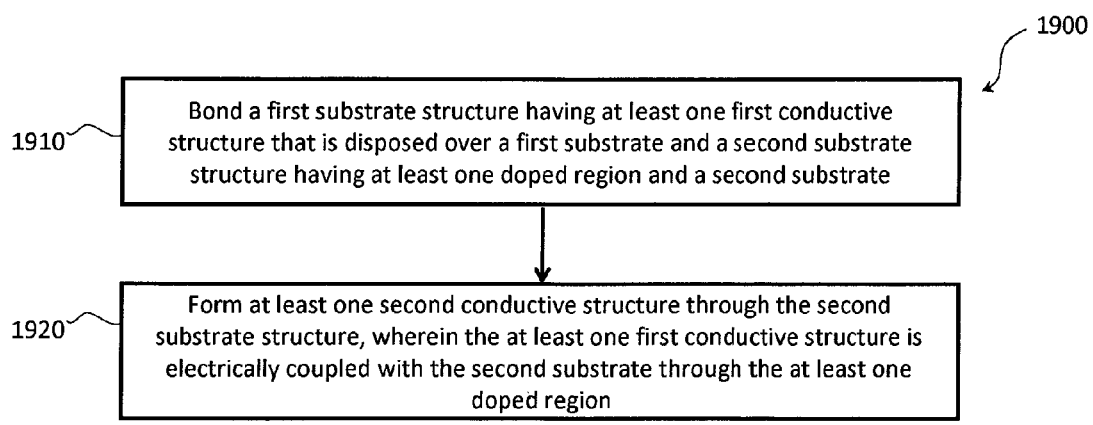
FIG. 19 is a flowchart illustrating an exemplary method of forming a package system including at least one doped region.

Following are descriptions related to methods of forming exemplary package systems. Illustrated in FIG. 19 is a flow-chart of an exemplary method of forming a package system. FIGS. 20A-20D are schematic cross-sectional views of package systems during various fabrication stages. Items of FIGS. 20A-20D that are the same or similar items in FIG. 8 are indicated by the same reference numerals, increased by 1200. It is understood that FIGS. 20A-20D have been simplified for a better understanding of the concepts of the present disclosure. Accordingly, it should be noted that additional processes may be provided before, during, and after the method of FIG. 19, and that some other processes may only be briefly described herein.

Referring to FIG. 19, a method 1900 of forming a package system can include bonding a first substrate structure having at least one first conductive structure that is disposed over a first substrate and a second substrate structure having at least one doped region and a second substrate (block 1910). The method 1900 can also include forming at least one second conductive structure through the second substrate structure, wherein the at least one first conductive structure is electrically coupled with the second substrate through the at least one doped region (block 1920).

Figure 20A:
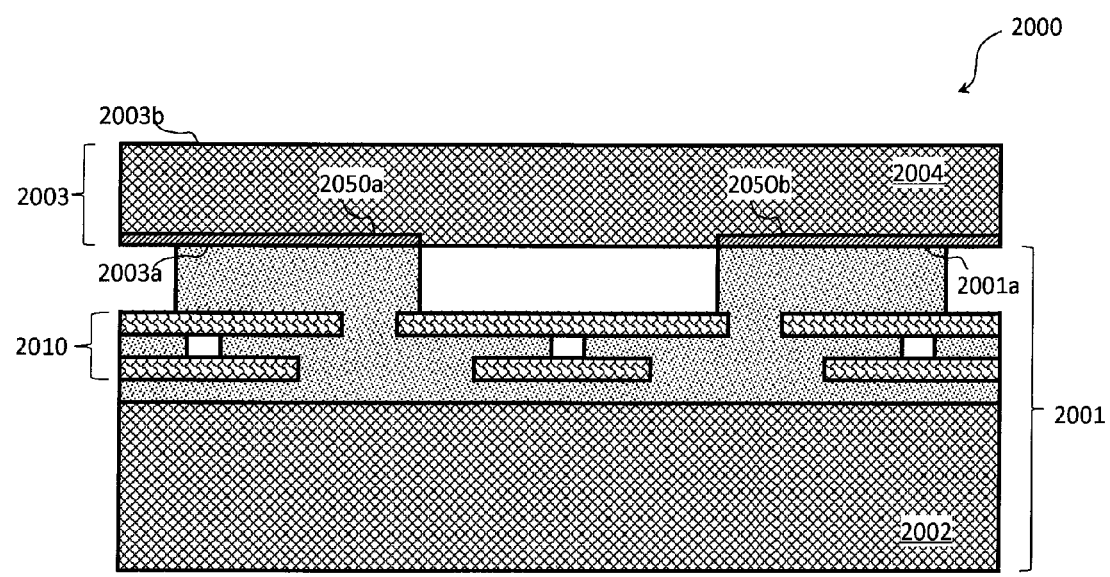
FIGS. 20A-20D are schematic cross-sectional views of package systems during various fabrication stages.

For example, the block 1910 can include bonding substrate structures 2001 and 2003 as shown in FIG. 20A. The substrate structure 2001 can include a conductive structure 2010 and the substrate structure 2003 can include doped regions 2050a and 2050b in the surface 2003a. In some embodiments, the substrate structures 2001 and 2003 can be bonded by, for example, a fusion bonding method. The doped regions 2050a and 2050b can be formed by, for example, an ion implantation process, a thermal diffusion, process, an in-situ doped process, other doped processes, and/or any combinations thereof. The doped regions 2050a and 2050b can be formed in the substrate structure 2003 before the bonding process.

Figure 20B:
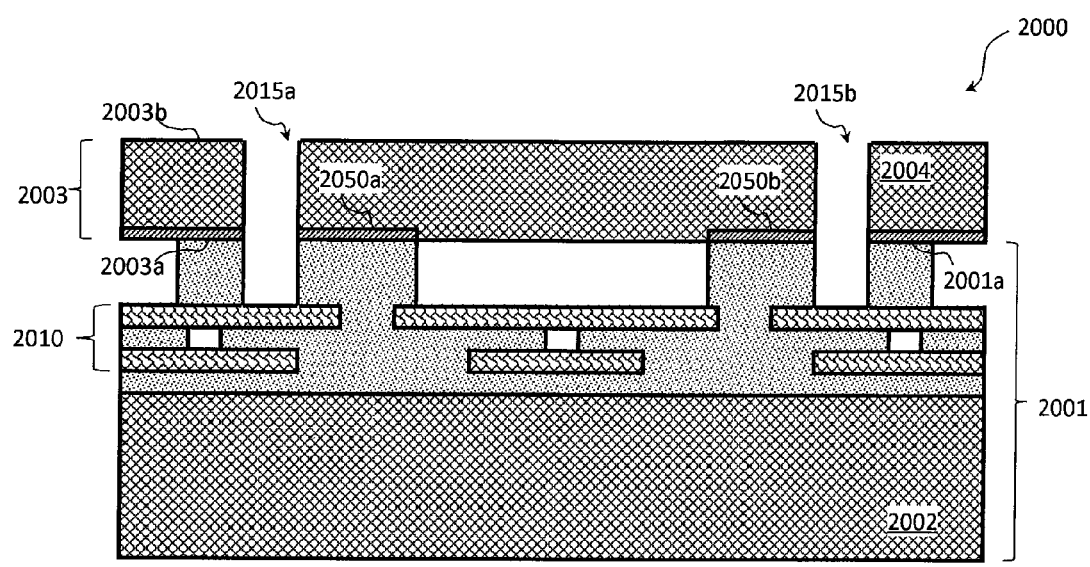

Referring to FIGS. 19 and 20B, the block 1920 can include forming at least one second conductive structure through the second substrate structure, wherein the at least one first conductive structure is electrically coupled with the second substrate through the at least one doped region. In some embodiments, the block 1920 can include an etch process forming at least one opening, e.g., openings 2015a and 2015b through the substrate structure 2003. In other embodiments, the etch process can also remove portions of the substrate structure 2001 as shown in FIG. 20B.

Figure 20C:
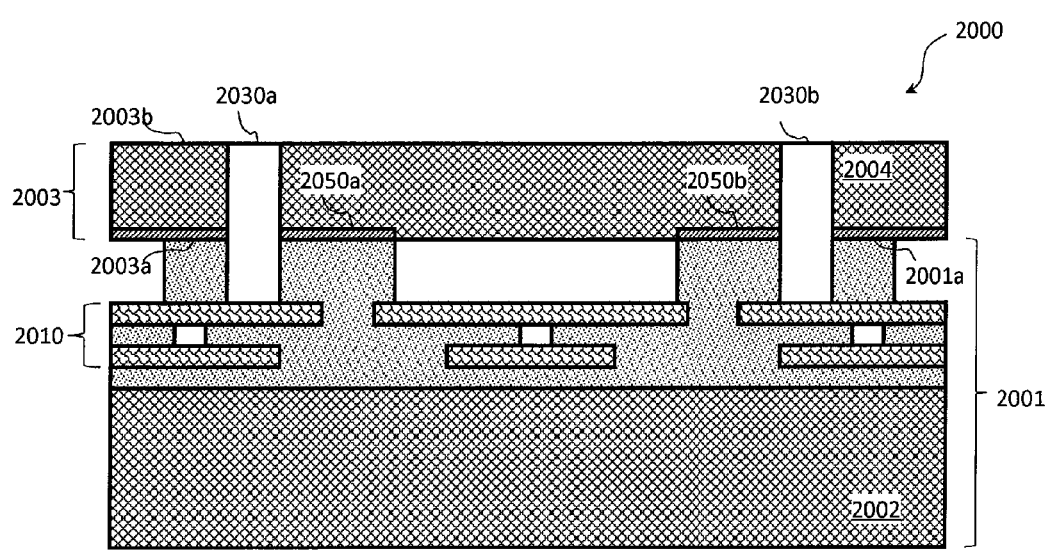
Figure 20D:
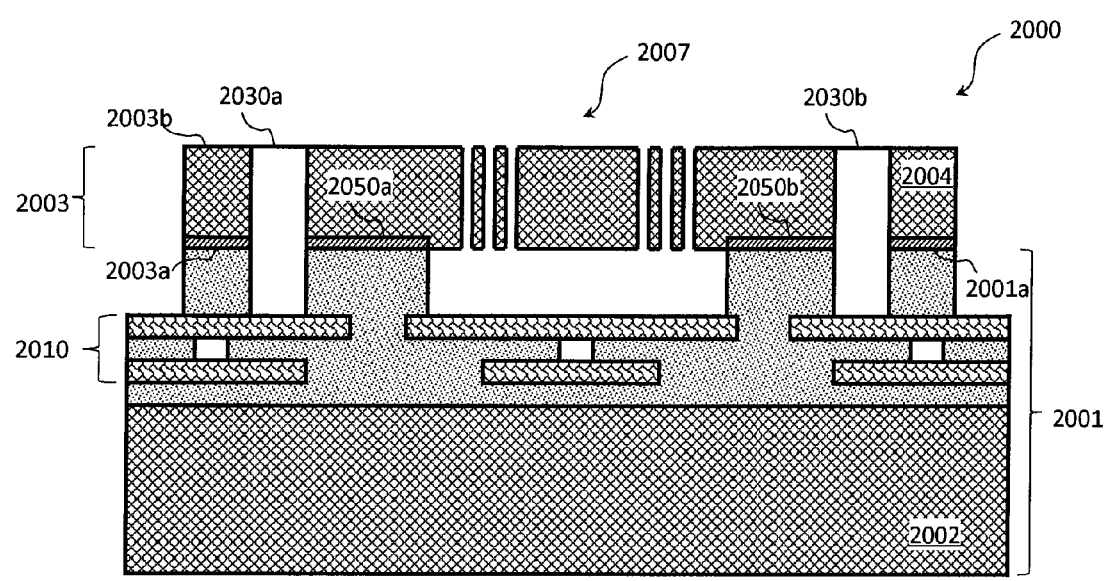

Referring to FIGS. 19 and 20C, the block 1920 can include forming conductive structures 2030a and 2030b within the openings 2015a and 2015b, respectively. Referring to FIGS. 19 and 20D, the method 1900 shown in FIG. 19 can remove a portion of the substrate structure 2003 and/or form the MEMS device 2007. The structure achieved can be similar to the structure shown in FIG. 8.

Figure 21:
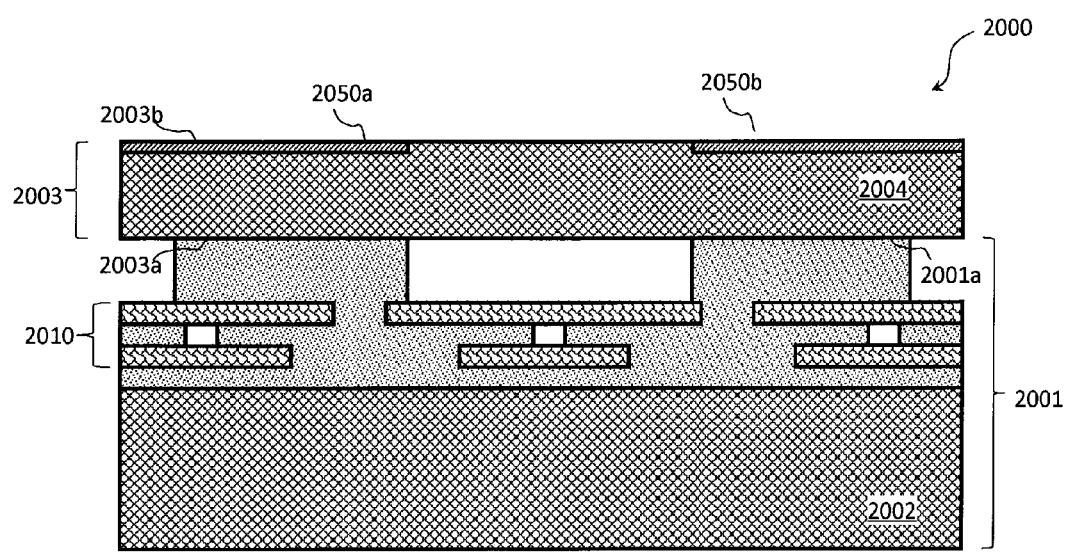
FIG. 21 is a cross-sectional view illustrating a fabrication stage of an exemplary method of forming a package system.

In some embodiments, the doped regions 2050a and 2050b can be formed in the surface 2030b as shown in FIG. 21. The surface 2003a can be bonded with the substrate structure 2001. After the bonding process, the method can proceed to perform the processes described above in conjunction with FIGS. 20B-20D. The structure achieved can be similar to the structure shown in FIG. 9.

Figure 22:
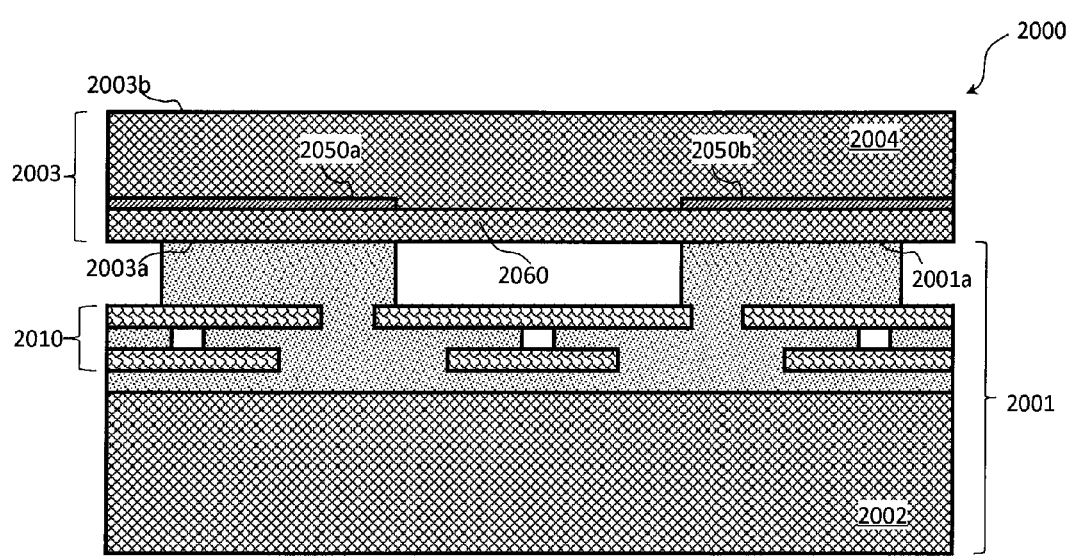
FIG. 22 is a cross-sectional view illustrating a fabrication stage of an exemplary method of forming a package system.

In some embodiments, the doped regions 2050a and 2050b can be formed in the substrate 2004. A silicon-containing layer 2060 can be formed adjacent to the doped regions 2050a and 2050b. The silicon-containing layer 2060 then can be bonded with the substrate structure 2001 as shown in FIG. 22.

In some embodiments, before the bonding process the doped regions 2050a and 2050b can be formed in the substrate structure 2003. After forming the doped regions 2050a and 2050b, the silicon-containing layer 2060 can be formed by, for example, an epitaxial process or a bonding process and adjacent to the doped regions 2050a and 2050b. The silicon-containing layer 2060 is then bonded with the substrate structure 2001. After the bonding process, the method can proceed to perform the processes described above in conjunction with FIGS. 20B-20D. The structure achieved can be similar to the structure shown in FIG. 10.

In a first exemplary embodiment, a package system includes a first substrate structure including at least one first conductive structure that is disposed over a first substrate. A second substrate structure includes a second substrate. The second substrate structure is bonded with the first substrate structure. The at least one first conductive structure is electrically coupled with the second substrate through at least one germanium-containing layer.

In a second exemplary embodiment, a package system includes a first substrate structure including at least one first conductive structure that is disposed over a first substrate. A second substrate structure includes a second substrate. The second substrate structure is bonded with the first substrate structure. The second substrate structure has at least one doped region. At least one second conductive structure is disposed through the second substrate structure. The at least one first conductive structure is electrically coupled with the second substrate through the at least one second conductive structure and the at least one doped region.

In a third exemplary embodiment, a first substrate structure includes at least one first conductive structure that is disposed over a first substrate. A second substrate structure includes a second substrate. The second substrate structure is bonded with the first substrate structure. At least one second conductive structure is disposed through the second substrate structure and electrically coupled with the at least one first conductive structure. At least one germanium-containing layer is disposed over and electrically coupled with the second substrate structure. A surface of the at least one germanium-containing layer is substantially leveled with a surface of the at least one second conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
   a first substrate structure including at least one first conductive structure that is disposed over a first substrate; and
   a second substrate structure including a second substrate, the second substrate structure being bonded with the first substrate structure, wherein the at least one first conductive structure is electrically coupled with the second substrate through at least one germanium-containing layer, wherein the second substrate structure comprises an opening through the second substrate structure, and at least a portion of the at least one germanium-containing layer is on at least one sidewall of the opening, and the at least one germanium-containing layer does not completely fill the opening.

2. The package system of claim 1, wherein the at least one germanium-containing layer continuously extend from the at least one first conductive structure to at least one sidewall of the opening.

3. The package system of claim 2, further comprising:
   at least one second conductive structure disposed in the opening and electrically coupled with the at least one first conductive structure through the at least one germanium-containing layer.

4. The package system of claim 3, wherein the least one germanium-containing layer is disposed around a portion of the at least one second conductive structure that is adjacent to a first surface of the second substrate structure, the first surface is opposite to a second surface of the second substrate structure which is bonded with the first substrate structure, and the least one germanium-containing layer is separated from the at least one first conductive structure.

5. The package system of claim 2, wherein the at least one germanium-containing layer further extends over a first surface of the second substrate structure, and the first surface is opposite to a second surface of the second substrate structure which is bonded with the first substrate structure.

6. The package system of claim 5, further comprising:
   at least one metallic material disposed over and electrically coupled with the at least one germanium-containing layer that extends over the first surface of the second substrate structure.

7. The package system of claim 1, further comprising:
   at least one second conductive structure through the second substrate structure and electrically coupled with the at least one first conductive structure, wherein the least one germanium-containing layer is disposed over and electrically coupled with the second substrate.

8. The package system of claim 7, wherein the at least one germanium-containing layer is electrically coupled with the at least one first conductive structure through the at least one second conductive structure.

9. The package system of claim 7, further comprising:
   at least one metallic material disposed over and electrically coupled with the at least one germanium-containing layer.

10. The package system of claim 7, wherein the at least one germanium-containing layer is directly disposed on the at least one second conductive structure.

11. The package system of claim 1, further comprising:
    at least one second conductive structure through the second substrate structure and electrically coupled with the at least one first conductive structure, wherein the second substrate structure has at least one doped region and the second substrate structure is electrically coupled with the first substrate structure through the at least one doped region.

12. The package system of claim 11, wherein the at least one doped region is disposed between the first substrate structure and the second substrate structure.

13. The package system of claim 11, wherein the at least one doped region is disposed over a first surface of the second substrate structure and the first surface is opposite to a second surface of the second substrate structure that is bonded with the first substrate structure.

14. The package system of claim 11, wherein the second substrate structure comprises at least one silicon-containing layer disposed over the doped region, and the at least one silicon-containing layer is bonded with the first substrate structure.

15. The package system of claim 1, wherein the at least one germanium-containing layer extends only partway through the opening.

16. A package system comprising:
    a first substrate structure including at least one first conductive structure that is disposed over a first substrate;
    a second substrate structure including a second substrate, the second substrate structure being bonded with the first substrate structure, the second substrate structure having at least one doped region; and
    at least one second conductive structure through the second substrate structure, the at least one first conductive structure being electrically coupled with the second substrate through the at least one second conductive structure and the at least one doped region.

17. The package system of claim 16, wherein the at least one doped region is disposed in a surface of the second substrate structure which is bonded with the first substrate structure.

18. The package system of claim 16, wherein the at least one doped region is disposed in a first surface of the second substrate structure and the first surface is opposite to a second surface of the second substrate structure that is bonded with the first substrate structure.

19. The package system of claim 16, wherein the second substrate structure comprises at least one silicon-containing layer disposed adjacent to the doped region, and the at least one silicon-containing layer is bonded with the first substrate structure.

20. A package system comprising:
- a first substrate structure including at least one first conductive structure that is disposed over a first substrate;
- a second substrate structure including a second substrate, the second substrate structure being bonded with the first substrate structure;
- at least one second conductive structure through the second substrate structure and electrically coupled with the at least one first conductive structure; and
- at least one germanium-containing layer is disposed over and electrically coupled with the second substrate structure, wherein a surface of the at least one germanium-containing layer is substantially leveled with a surface of the at least one second conductive structure.

* * * * *